(12) United States Patent
Miller et al.

(10) Patent No.: US 7,780,866 B2
(45) Date of Patent: Aug. 24, 2010

(54) METHOD OF PLASMA CONFINEMENT FOR ENHANCING MAGNETIC CONTROL OF PLASMA RADIAL DISTRIBUTION

(75) Inventors: Matthew L. Miller, Fremont, CA (US); Daniel J. Hoffman, Saratoga, CA (US); Steven C. Shannon, San Mateo, CA (US); Michael Kutney, Santa Clara, CA (US); James Carducci, Sunnyvale, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 493 days.

(21) Appl. No.: 11/751,592

(22) Filed: May 21, 2007

(65) Prior Publication Data
US 2008/0110860 A1    May 15, 2008

Related U.S. Application Data

(60) Provisional application No. 60/859,557, filed on Nov. 15, 2006.

(51) Int. Cl.
| B44C 1/22 | (2006.01) |
| C03C 15/00 | (2006.01) |
| C03C 25/68 | (2006.01) |
| C23F 1/00 | (2006.01) |

(52) U.S. Cl. .......................................... 216/68; 216/71

(58) Field of Classification Search ................... 216/68, 216/71; 438/731; 118/715; 156/345.26, 156/345.29, 345.48
See application file for complete search history.

(56) References Cited

U.S. PATENT DOCUMENTS

| 6,178,919 B1 | 1/2001 | Li et al. .................... 118/723 E |
| 6,387,287 B1 | 5/2002 | Hung et al. .................... 216/67 |

(Continued)

OTHER PUBLICATIONS

U.S. Appl. No. 11/751,575, filed May 21, 2007, Miller et al.

(Continued)

*Primary Examiner*—Roberts Culbert
(74) *Attorney, Agent, or Firm*—Law Office of Robert M. Wallace

(57) ABSTRACT

A method for processing a workpiece in a plasma reactor. The method comprises constraining plasma in the chamber away from the floor of the pumping annulus, providing an annular baffle while compensating for asymmetry of gas flow attributable to the pumping port, and providing a gas flow equalizer below the baffle having an eccentrically shaped opening. The method further includes modifying the radial distribution of plasma ion density and providing a magnetic plasma steering field having an edge high plasma ion density distribution tendency. The method further comprises locating the baffle at a sufficient distance below the workpiece to provide an edge low plasma ion density distribution tendency that compensates the edge high plasma ion density distribution tendency of the magnetic plasma steering field.

20 Claims, 19 Drawing Sheets

U.S. PATENT DOCUMENTS

| | | |
|---|---|---|
| 6,528,751 B1 | 3/2003 | Hoffman et al. ........ 219/121.43 |
| 6,853,141 B2 | 2/2005 | Hoffman et al. ........ 315/111.21 |
| 6,991,701 B2 | 1/2006 | Takenaka et al. ........ 156/345.51 |
| 2002/0088542 A1 | 7/2002 | Nishikawa et al. ..... 156/345.29 |
| 2002/0134308 A1 | 9/2002 | Armano ....................... 118/715 |
| 2003/0094135 A1 | 5/2003 | Komiya et al. .............. 118/715 |
| 2003/0218427 A1 | 11/2003 | Hoffman et al. ........ 315/111.41 |
| 2004/0063333 A1 | 4/2004 | Saigusa et al. .............. 438/758 |
| 2004/0159286 A1 | 8/2004 | Aoki et al. ................ 118/723 E |
| 2004/0206309 A1 | 10/2004 | Bera et al. ................... 118/728 |
| 2005/0121143 A1 | 6/2005 | Daugherty et al. ..... 156/345.29 |
| 2006/0172542 A1 | 8/2006 | Bera et al. ................... 438/706 |

OTHER PUBLICATIONS

Rauf, Shahid and Kushner, Mark, "Argon metastable densities in radio frequency Ar, $Ar/O_2$, and $Ar/CF_4$ electrical discharges", Journal of Applied Physics, Sep. 15, 1997, pp. 2805-2813, vol. 82(6), American Institute of Physics.

METHOD OF PLASMA CONFINEMENT FOR ENHANCING MAGNETIC CONTROL OF PLASMA RADIAL DISTRIBUTION

CROSS-REFERENCE TO RELATED APPLICATIONS

This application claims the benefit of U.S. Provisional Application Ser. No. 60/859,557, filed Nov. 15, 2006.

TECHNICAL FIELD

The embodiments of the present invention generally relate to method and apparatus for high flow conductance axial confinement of plasma and flow equalization that enhances magnetic control of radial distribution of plasma and enhances radial confinement of the plasma by impedance confinement.

BACKGROUND

Plasma processing of semiconductor wafers in the manufacture of microelectronic integrated circuits is used in dielectric etching, metal etching, chemical vapor deposition and other processes. In semiconductor substrate processing, the trend towards increasingly smaller feature sizes and linewidths has placed a premium on the ability to mask, etch, and deposit material on a semiconductor substrate, with greater precision.

Typically, etching is accomplished by applying radio frequency (RF) power to a working gas supplied to a low pressure processing region over a substrate supported by a support member. The resulting electric field creates a reaction zone in the processing region that excites the working gas into a plasma. The support member is biased to attract ions within the plasma towards the substrate supported thereon. Ions migrate towards a boundary layer or sheath of the plasma adjacent to the substrate and accelerate upon leaving the boundary layer. The accelerated ions produce the energy required to remove, or etch, the material from the surface of the substrate. As the accelerated ions can etch other components within the processing chamber, it is important that the plasma be confined to the processing region above the substrate and away from the side wall of the chamber.

Unconfined plasmas cause etch-byproduct (typically polymer) deposition on the chamber walls and could also etch the chamber walls. Etch-byproduct deposition on the chamber walls could cause the process to drift. The etched materials from the chamber walls could contaminate the substrate by re-deposition and/or could create particles for the chamber. In addition, unconfined plasmas could also cause etch-byproduct deposition in the downstream areas. The accumulated etch-byproduct can flake off and result in particles. To reduce the particle issues caused by the deposition of etch-byproduct in the downstream areas, an additional post-etch (downstream) cleaning step is needed, which could reduce process throughput and increase processing cost.

Confined plasmas could reduce chamber contamination, chamber cleaning and improve process repeatability (or reduce process drift).

SUMMARY

A method is provided for processing a workpiece in a plasma reactor chamber. The chamber may be of the type that is bounded by a side wall with an overlying ceiling electrode coupled to a supply of VHF plasma source power. The chamber may further have a workpiece support pedestal with a workpiece support surface within the chamber and a pumping annulus between the pedestal and the side wall. A plasma processing region lies between the pedestal and a ceiling of the chamber. Furthermore, a pumping port is provided in a floor of the pumping annulus, the pumping port being small relative to the pumping annulus so as to give rise to an asymmetrical flow of process gases across the workpiece. The method comprises constraining plasma in the chamber away from the floor of the pumping annulus by providing an annular baffle extending from the pedestal into the pumping annulus to constrict flow of gas and plasma through the pumping annulus. The asymmetry of gas flow attributable to the pumping port is compensated by providing a gas flow equalizer below the baffle having an eccentrically distributed gas flow opening surrounding the pedestal. The radial distribution of plasma ion density over the pedestal is modified, typically in order to improve process uniformity across the workpiece. This is accomplished by a controlling a magnetic plasma steering field, which happens to have an edge high plasma ion density distribution tendency. The method further comprises locating the baffle at a distance below the workpiece support surface, the distance providing an edge low plasma ion density distribution tendency that compensates the edge high plasma ion density distribution tendency of the magnetic plasma steering field.

In a further aspect, the method can further comprise constraining plasma in the chamber away from the side wall by providing an impedance confinement condition. In the impedance confinement condition, the side wall has a VHF voltage lying between the VHF voltages on the workpiece and on the ceiling electrode, respectively. The distance of the baffle below the workpiece support surface is sufficient for the impedance confinement condition to reduce plasma ion density over or near the periphery of the workpiece support pedestal. The impedance confinement condition is provided by separately selecting or adjusting: (a) a capacitance to ground of the ceiling electrode, and (b) a capacitance to ground of the workpiece support surface.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

Embodiments of the present invention are concerned with axially confining the plasma to prevent plasma from entering the region of the chamber below the wafer or workpiece while simultaneously compensating for an asymmetrical pattern of gas flow to the exhaust port. In one further aspect, embodiments of the present invention are concerned with accomplishing the foregoing in such a way as to improve the uniformity of radial plasma distribution attained with magnetic control. In another aspect, embodiments of the present invention are concerned with accomplishing the foregoing in such a way as to improve the radial plasma confinement attained by impedance confinement. The processing conducted in the plasma process chamber could be deposition, etching or plasma-treatment. Embodiments of the present invention can be applied to any type of plasma processing, including plasma etch processes, plasma enhanced chemical vapor deposition processes, physical vapor deposition processes and the like.

Figure 1A:
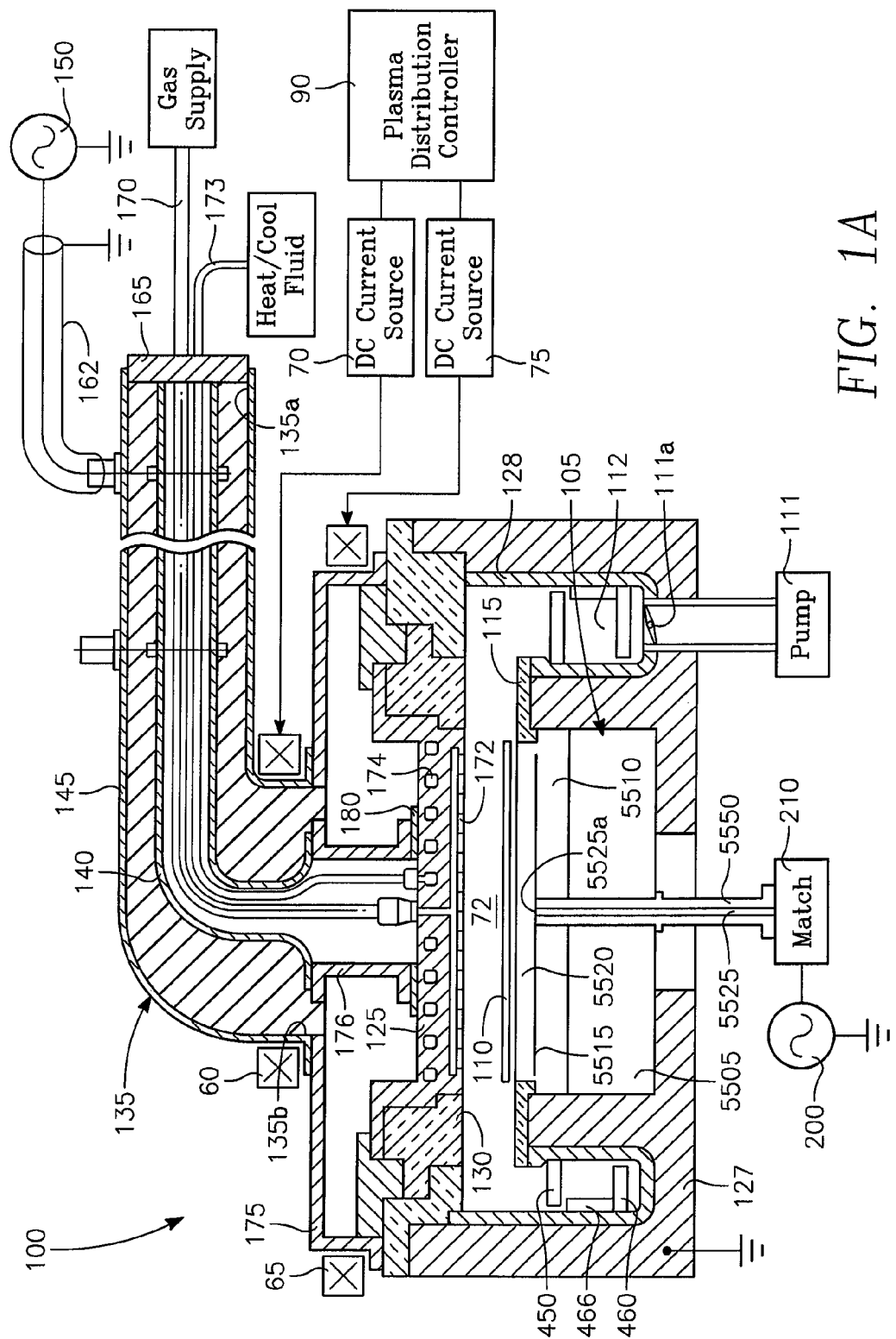
FIG. 1A shows a schematic drawing of a plasma processing chamber.

FIG. 1A illustrates an example of a plasma reactor, such as the Enabler® etch system manufactured by Applied Materials, Inc., of Santa Clara, Calif., that includes a reactor chamber 100, which may include liners to protect the walls, with a substrate support (or pedestal) 105 at the bottom of the chamber supporting a semiconductor wafer 110. The chamber 100 includes a disc shaped overhead aluminum electrode 125 supported at a predetermined gap length above the wafer 110 on grounded chamber body 127 by a dielectric (quartz) seal 130. A processing region 72 is defined between the overhead electrode 125 and the substrate support 105. A power generator 150 applies very high frequency (VHF) power to the electrode 125. VHF is typically between about 30 MHz to about 300 MHz and is one of the RF bands, which range from about 10 kHz to about 10 GHz. In one embodiment, the VHF source power frequency is 162 MHz for a 300 mm wafer diameter. VHF power from the generator 150 is coupled through a coaxial cable 162 matched to the generator 150 and into a coaxial stub 135 connected to the electrode 125. The stub 135 has a characteristic impedance and a stub resonant frequency, and provides an impedance match between the electrode 125 and coaxial cable 162 or the VHF power generator 150. The chamber body is connected to the VHF return (VHF ground) of the VHF generator 150. Bias power is applied to the wafer by a bias RF power generator 200 coupled through a conventional impedance match circuit 210 to the wafer support 105. The power level of the bias generator 200 controls the ion energy near the wafer surface. The bias power (typically at 13.56 MHz) is typically used to control ion energy, while the VHF source power is applied to the overhead electrode to govern plasma density. A vacuum pump system 111 evacuates the chamber 100 through a plenum 112.

The substrate support 105 includes a metal pedestal layer 5505 supporting a lower insulation layer 5510, an electrically conductive mesh layer 5515 overlying the lower insulation layer 5510 and a thin top insulation layer 5520 covering the conductive mesh layer 5515. The semiconductor workpiece or wafer 110 is placed on top of the top insulation layer 5520. The substrate support 105 and the wafer 110 form a cathode during substrate processing. If the wafer 110 is not present, the substrate support 105 is the cathode during plasma processing. The electrically conductive mesh layer 5515 and the metal pedestal layer 5505 may be formed of materials such as molybdenum and aluminum respectively. The insulation layers 5510 and 5520 may be formed of materials such as aluminum nitride or alumina. The conductive mesh layer 5515 applies the RF bias voltage to control ion bombardment energy at the surface of the wafer 110. RF power from the RF bias generator 200 is fed from the bias impedance match 210 to the conductive mesh layer 5515 through an RF conductor 5525 that is connected to the conductive mesh layer 5515 at an RF feedpoint 5525a. The conductive mesh layer 5515 also can be used for electrostatically chucking and de-chucking the wafer 110, and in such a case can be connected to a chucking voltage source in the well-known fashion. The conductive mesh layer 5515 therefore is not necessarily grounded and can have, alternately, a floating electric potential or a fixed D.C. potential in accordance with conventional chucking and de-chucking operations. The wafer support 105, in particular the metal pedestal layer 5505, typically (but not necessarily) is connected to ground, and forms part of a return path for VHF power radiated by the overhead electrode 125.

In one embodiment, a dielectric cylindrical sleeve 5550 is provided and configured to surround the RF conductor 5525. The uniformity of impedance across the substrate support is also enhanced with the dielectric sleeve 5550. The axial length and the dielectric constant of the material constituting the sleeve 5550 determine the feed point impedance presented by the RF conductor 5525 to the VHF power. By adjusting the axial length and the dielectric constant of the material constituting the sleeve 5550, a more uniform radial distribution of impedance can be attained, for more uniform capacitive coupling of VHF source power.

A terminating conductor 165 at the far end 135a of the stub 135 shorts the inner and outer conductors 140, 145 together, so that the stub 135 is shorted at its far end 135a. At the near end 135b (the unshorted end) of the stub 135, the outer conductor 145 is connected to the chamber body via an annular conductive housing or support 175, while the inner conductor 140 is connected to the center of electrode 125 via a conductive cylinder or support 176. A dielectric ring 180 is held between and separates the conductive cylinder 176 and the electrode 125.

The inner conductor 140 can provide a conduit for utilities such as process gases and coolant. The principal advantage of this feature is that, unlike typical plasma reactors, the gas line 170 and the coolant line 173 do not cross large electrical potential differences. They therefore may be constructed of metal, a less expensive and more reliable material for such a purpose. The metallic gas line 170 feeds gas inlets 172 in or adjacent the overhead electrode 125 (so that the overhead electrode 125 is a gas distribution plate) while the metallic coolant line 173 feeds coolant passages or jackets 174 within the overhead electrode 125.

As described earlier, unconfined plasmas cause etch-byproduct (typically polymer) deposition on the chamber walls and could also etch the chamber walls. Etch-byproduct deposition on the chamber walls could cause the process to drift. The etched materials from the chamber walls could contaminate the substrate by re-deposition and/or could create particles for the chamber. In addition, unconfined plasmas could also reach the downstream areas of the processing zone and deposit etch-byproduct, which is typically polymer, in the downstream areas. The etch-byproduct deposited in the downstream areas is difficult to clean. The accumulated etch-byproduct can flake off and result in particles.

Figure 1B:
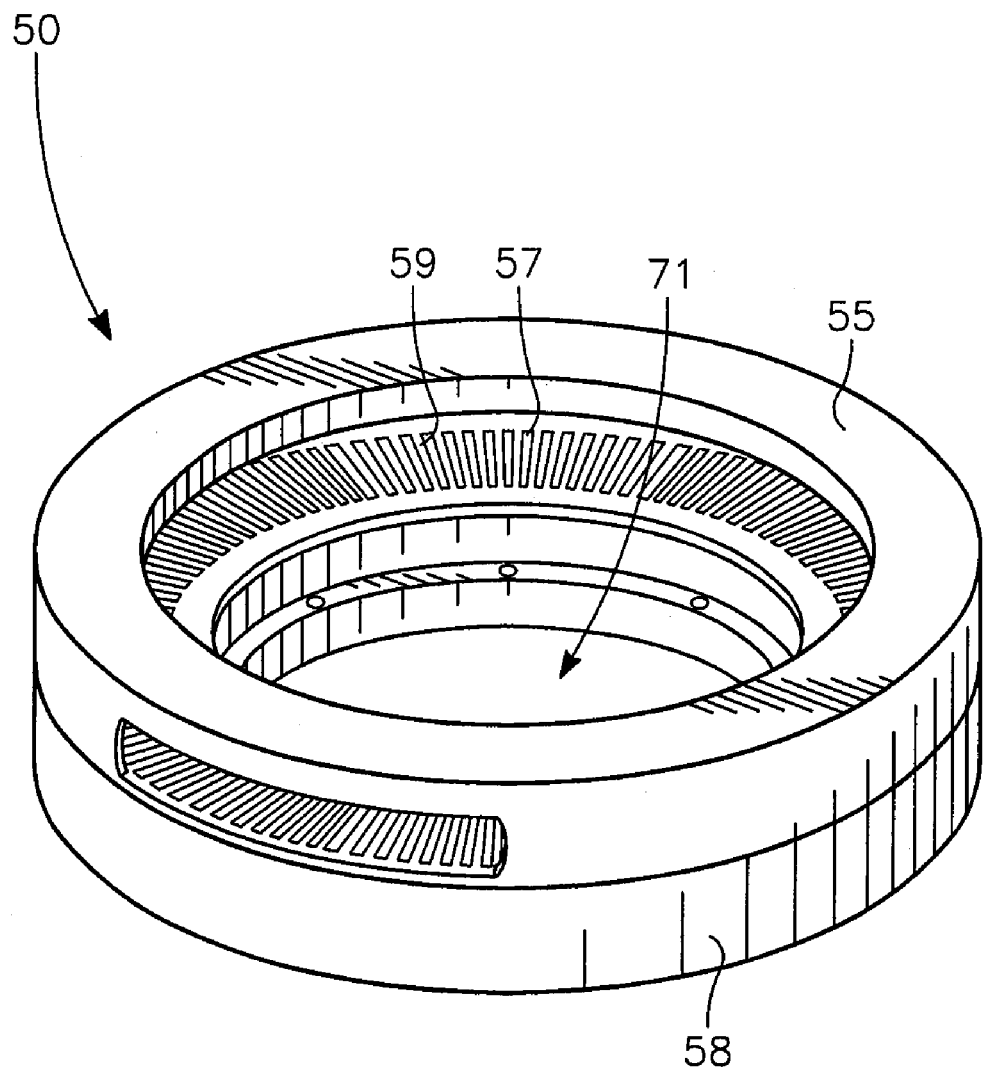
FIG. 1B illustrates a perspective view of a slotted confinement ring that can be used in the embodiment of FIG. 1A.

In one embodiment, a slotted confinement ring illustrated in FIG. 1B may be provided and placed inside the chamber 100 of FIG. 1A around the workpiece support 105 and extending axially between the overhead electrode 125 and substrate support 105. The slotted confinement ring may be used to reduce particle contaminants and cleaning time for the chamber. FIG. 1B illustrates a perspective view of the slotted confinement ring 50 in accordance with one embodiment. The confinement ring 50 is configured to confine plasma and to reduce gas flow resistance. The confinement ring 50 includes a baffle 55 and a base 58 coupled to a bottom portion of the baffle 55. The base 58 is generally configured to provide electrical grounding and mechanical strength for the confinement ring 50. The baffle 55 defines an opening 71 at its top portion. The opening 71 is configured to receive the showerhead of the overhead electrode or gas distribution plate 125 of FIG. 1A, so that gas flow will be confined inside the baffle 55. The baffle 55 further includes a plurality of slots 57 and a plurality of fingers 59. The slots 57 are designed such that the thickness or width of the plasma sheath is greater than the width of each slot. In this manner, ions and radicals in the plasma are prevented from passing through the confinement ring 50. In one embodiment, each slot 57 is designed with a width of less than about twice the width or thickness of the plasma sheath. The confinement ring 50 may be made from a material that is electrically conductive to provide a ground path for the RF power supply and the VHF power supply when the plasma is in contact with the confinement ring 50. The confinement ring 50 may also be made from a material that is thermally conductive and etch resistant to minimize localized heating, contamination and process drift. For example, the baffle 55 may be made from silicon carbide (SiC), while the base 58 may be made from aluminum (Al).

In one embodiment, a flat annular ring 115 shown in FIG. 1A is employed. The annular ring 115 is placed around the substrate 110 with a distance (or gap) from inner chamber side wall 128. The annular ring 115 is configured and placed in the chamber such that the ring 115 provides desirable plasma confinement and low flow resistance. The distance (or gap) between the edge of the annular ring 115 and the inner chamber wall 128 should not be too large. If the gap distance is larger than the plasma sheath thickness near the chamber wall 128, it could increase the amount of plasma being drawn away from the reaction zone above the wafer and toward the chamber wall and downstream, which makes the plasma less confined. The distance (or gap) between the edge of the annular ring 115 and the inner chamber wall 128 cannot be too small either, since the flow resistance, which affects the chamber pressure, would increase to an unacceptable level. The annular ring 115, placed around the substrate 110 with a suitable distance from the inner chamber wall 128, meets the requirement of good plasma confinement and low flow resistance.

Figure 2A:
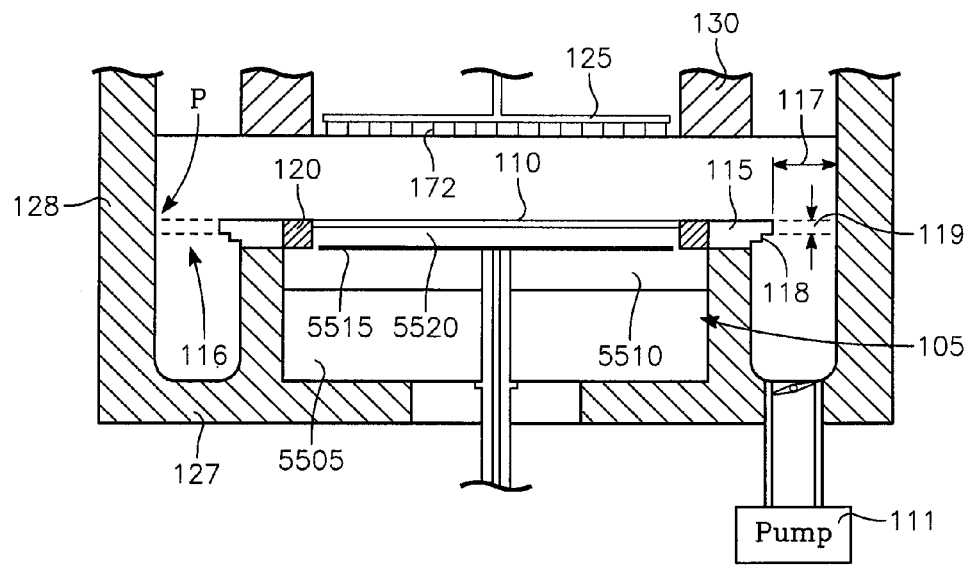
FIG. 2A shows a schematic drawing of a plasma processing chamber with one embodiment of an annular plasma confinement ring in the process chamber.

FIG. 2A shows a schematic drawing of an embodiment of the processing chamber with the annular plasma confinement ring 115. The annular ring 115 could be made of conductive materials, such as silicon carbide (SiC) or aluminum (Al).

Figure 2B:
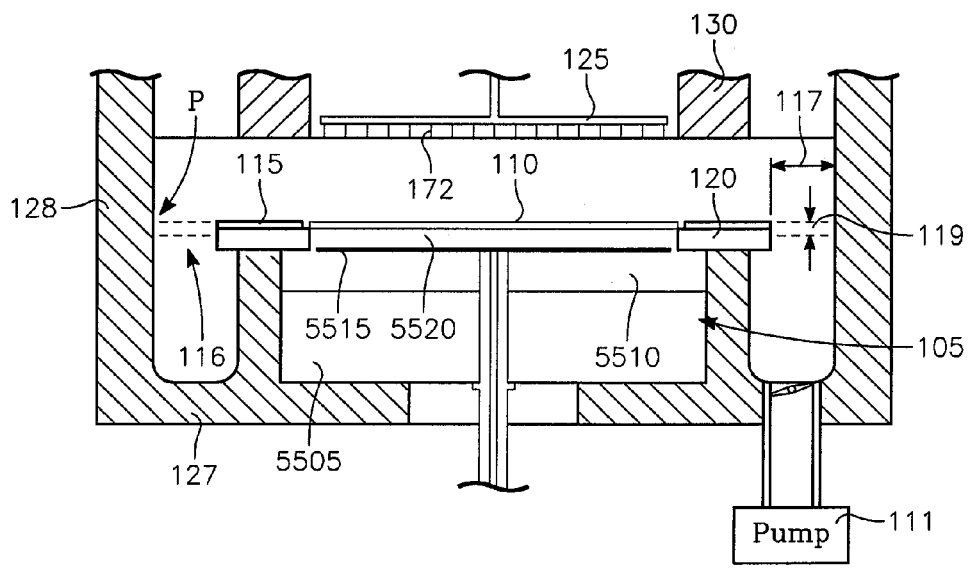
FIG. 2B shows a schematic drawing of a plasma processing chamber with another embodiment of an annular plasma confinement ring in the process chamber.

The annular ring 115 surrounds the wafer 110. The annular ring 115 is coupled to the grounded chamber body 127 and is electrically separated from the substrate support 105 by a dielectric (quartz) ring 120, which prevents the conductive annular ring 115 from touching the substrate 110 and conductive mesh layer 5515 to prevent eliminating the effect of bias power. In one embodiment, the lowest point of the dielectric ring 120 is below the lowest point of the conductive mesh layer 5515. In one embodiment, the top surface of the annular ring 115 is at about the same surface plane as the substrate 110 to allow the substrate 110 to be placed properly on the substrate support 105 and to minimize flow re-circulation. The top surface of the dielectric ring 120 could be at the same height as the top surface of substrate 110 and the top surface of the annular ring 115, as shown in the embodiment in FIG. 2A. In yet another embodiment, the top surface of the dielectric ring 120 is also slightly lower than the top surface of substrate 110 and the top surface of the annular ring 115, as shown in another embodiment in FIG. 2B. In the embodiment shown in FIG. 2B, the plasma confinement annular ring 115 is placed on top of the dielectric ring 120.

The annular ring 115 is spaced away from the inner chamber wall 128 at a gap width 117. The thickness 119 of the top section of the annular ring 115 is chosen to be optimal for the low flow resistance. The thickness 119 of the top section of the annular ring 115 should not be too thick, since the flow resistance would increase with increasing thickness 119. In one embodiment, the thickness 119 is in the range between about ⅛ inch to about ¼ inch. The corner 118 of the annular ring 115 is used to provide the annular ring mechanical strength, since the top section with thickness 119 is limited in its thickness and mechanical strength. Structures other than the corner 118 that can provide mechanical strength can also be used.

The impact of the gap width 117 on the effectiveness of plasma confinement and the chamber pressure, chamber plasma density and pressure have been analyzed for the annular ring design and the slotted ring design for comparison through the use of various simulations. For chamber pressure simulation, computation fluid dynamics (CFD) software CFD-ACE+ by ESI group of France is used. CFD-ACE+ is a general, partial differential equation (PDE) solver for a broad range of physics disciplines including: flow, heat transfer, stress/deformation, chemical kinetics, electrochemistry, and others. The software solves them in multidimensional (0D to 3D), steady and transient form. CFD-ACE+ is used for complex multiphysics and multidisciplinary applications. For the current study, the "Flow" module of the software is used. Pressure simulation by using the "Flow" module of CFD-ACE+ simulator matches experimental results quite well. Table 1 shows comparison of simulation and experimental results for a reactor of the type described in FIG. 1A having the slotted plasma confinement ring 50 of FIG. 1B. In Table 1, the pump pressure refers to the pressure set value for pump 111 of FIG. 1A. The chamber inner radius is 27 cm and the distance between the wafer 110 and the lower surface of the top electrode 125 is 3.2 cm. The chamber pressure data are collected at 6.8 cm away from the wafer center and right above the wafer. The below-ring pressure data are collected right beneath the slotted confinement ring. The results show a good match between the simulated and experimental results. The results also show that the slotted confinement ring has relatively high flow resistance and increases the pressure inside the reaction chamber significantly above the pressure set value.

TABLE 1

Experimental and simulated chamber pressure and below-ring pressure comparison.

| Gas Flow (sccm) | "Set" Pump Pressure (mTorr) | Measured Chamber Pressure (mTorr) | Simulated Chamber Pressure (mTorr) | Measured Below-Ring Pressure (mTorr) | Simulated Below-Ring Pressure (mTorr) |
|---|---|---|---|---|---|
| 2000 | 40 | 55.6 | 58.8 | 40.2 | 43.5 |
| 900 | 10 | 21.5 | 25.0 | 11.6 | 14.5 |
| 900 | 40 | 46.5 | 49.3 | 40.2 | 41.6 |

The chamber plasma density simulation uses the hybrid plasma equipment model (HPEM), developed by the Department of Electrical and Computer Engineering of University of Illinois at Urbana-Champaign, Urbana, Ill. The HPEM is a comprehensive modeling platform for low pressure (<10's Torr) plasma processing reactors. Details about plasma density simulation by this simulator can be found in an article, titled "Argon Metastable Densities In Radio Frequency Ar, $Ar/O_2$ and $Ar/CF_4$ Electrical Discharges", published in pages 2805-2813 of Journal of Applied Physics, volume 82 (6), 1997. The plasma simulator is widely used in the semiconductor equipment industry. Our experience shows that plasma simulation of process parameter variation by HPEM matches the process results quite well.

In one embodiment, the annular ring 115 of FIG. 2A includes a gap width 117 from 0.5 inch to 3 inch. An exemplary process condition used is one that resembles the contact etch and deep trench etch mentioned previously. A high gas flow rate of 1500 sccm is used. In one embodiment, the process gas only includes $O_2$, instead of including other types of process gases, such as $C_4F_6$ and argon (Ar), to simplify the simulation. For plasma confinement study that compares degree of plasma confinement as a function of the gap width 117, using only $O_2$ gas in simulation could provide learning of the impact of the gas distance 117 on plasma confinement. The top electrode power (or source power) simulated is 1.85 KW and the gas temperature is 80° C. The total source power is 1.85 kW. The top electrode voltage (or source voltage), $V_s$, is typically between about 100 to about 200 volts. 175 volts of $V_s$ has been used in the simulation. The radius of the substrate (or wafer) is 15 cm (or 6 inch) and the spacing between the top electrode to the substrate is 3.2 cm (or 1.25 inch). The radius of inner chamber wall 128 is 27 cm (or 10.6 inch). The width of the dielectric ring 120 is 2.2 cm (or 0.87 inch) and the width of the annular plasma confinement ring 115 simulated varies between 8.5 cm (or 3.3 inch) to 2.2 cm (or 0.9 inch). The spacing between the annular confinement ring 115 with the inner chamber wall 128 simulated varies between 1.3 cm (or 0.5 inch) to 7.6 cm (or 3.0 inch).

Figure 2C:
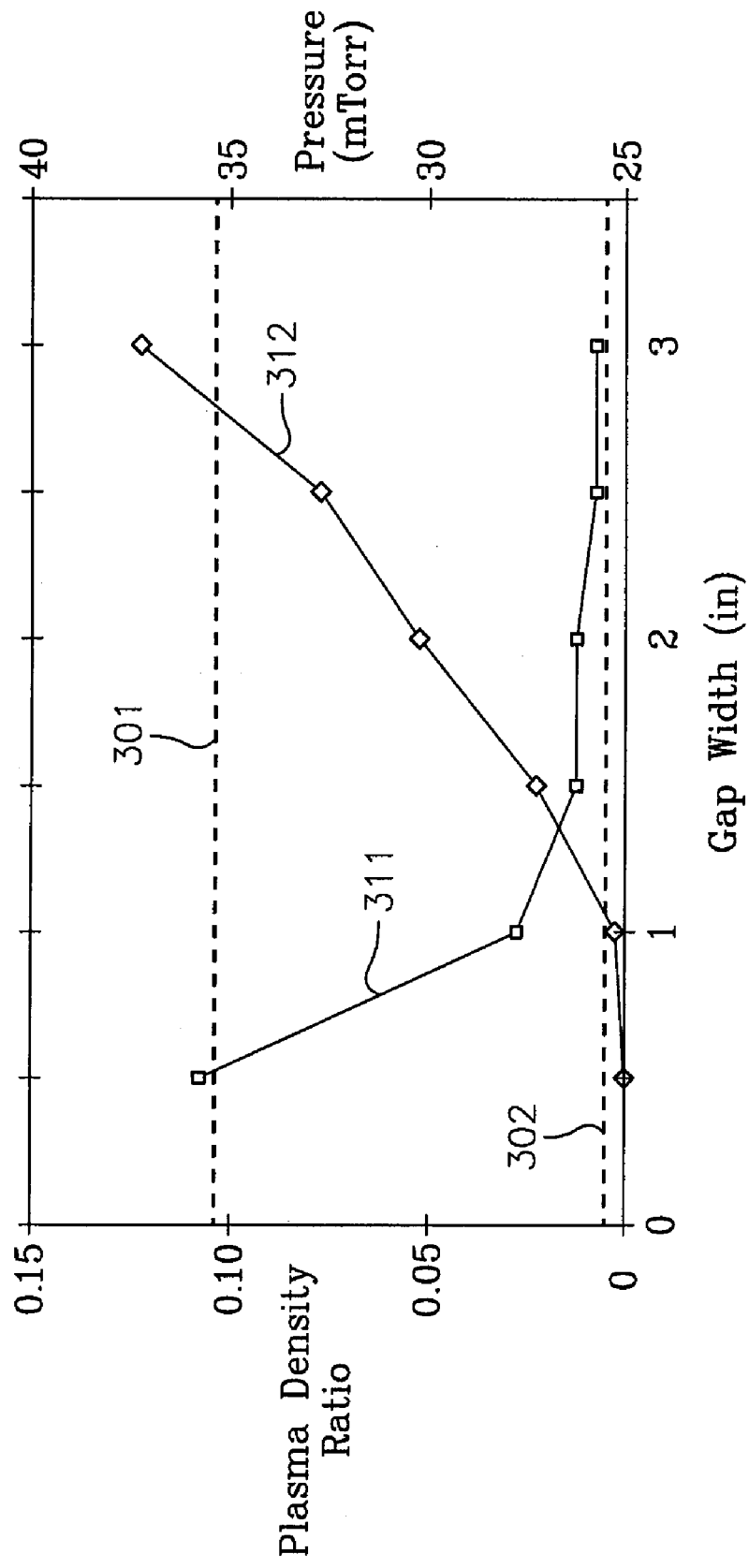
FIG. 2C shows the simulated results of plasma density ratio and chamber pressure as a function of the gap width.

FIG. 2C shows plasma simulation results for the plasma chamber described in FIG. 1A with an annular ring 115 described in FIG. 2A. In a low pressure plasma chamber, pressure and plasma density are not completely uniform across the entire chamber. The pressure is typically higher near the center of the wafer, lower near the wafer edge, and reaches the pump pressure set point at the pump. The pressure data in FIG. 2C are pressure at intersection of the chamber wall and the wafer top surface plane, or location "P" in FIG. 2A. In order to quantify the degree of confinement level, a plasma density ratio is defined as the ratio of maximum plasma density below line 116, which is extended along right below the top section of the annular ring 115, to the maximum plasma density in the process chamber, which occurs in the volume between the wafer surface and the overhead aluminum electrode 125. The lower the plasma density ratio, the better the plasma confinement ring has performed in confining plasma.

The dashed line 301 in FIG. 2C shows the 35.3 mTorr chamber pressure for the slotted confinement ring design. Dashed line 302 in FIG. 2C shows the 0.004 plasma density ratio obtained for the slotted confinement ring design. The 35.3 mTorr chamber pressure and 0.004 plasma density ratio are both obtained from simulation results. Since slotted ring design does not vary the gap width 117, the dashed lines 301 and 302 are horizontal lines. Curve 311 shows chamber pressure as a function of gap width 117, while curve 312 shows plasma density ratio as a function of gap width 117. For annular ring design at 0.5 inch gap width, the chamber pressure is found to be 35.8 mTorr, which is higher than the slotted confinement ring design, and the plasma density ratio is 0.00013, which is lower than the slotted confinement ring design. Although the lower plasma density ratio is desirable, the higher chamber pressure is not. When the gap width 117 is increased to 1 inch, the chamber pressure reduces to 27.9 mTorr, which is lower than the slotted ring design and lower than the low pressure requirement of <30 mTorr for front end process, and the plasma density ratio is 0.002, which is still lower than the slotted ring design. When the gap width 117 is increased to 1.5 inch, the chamber pressure further reduces to 26.2 mTorr, and the plasma density ratio is 0.023, which is higher than the slotted ring design but is still relatively low. As the gap width 117 increases beyond 1.5 inch, the effect of the wider gap width 117 in lowering the chamber pressure is reduced; however, the plasma density ratio continues to increase.

Table 2 shows a comparison of simulation results for a reactor described in FIG. 1A with the slotted plasma confinement ring 50 of FIG. 1B and for a reactor with the annular plasma confinement ring 115 described in FIG. 2A. The gap distance between the annular ring and the chamber wall 128 is 1 inch. In Table 2, the pump pressure refers to the pressure set value for pump 111 of FIG. 1A. The chamber inner radius is 27 cm and the distance between the wafer 110 and the lower surface of the top electrode 125 is 3.2 cm. The chamber pressure data are collected at 6.8 cm away from the wafer center and right above the wafer. The below-ring pressure data are collected right beneath the slotted confinement ring or the annular ring. The results show that the chamber pressure is higher for the slotted plasma confinement ring than the annular plasma confinement ring. In addition, the pressure difference between the chamber and below the confinement ring is higher for the slotted ring ($\Delta P=15.3$ mTorr) than the annular ring ($\Delta P=9.4$ mTorr).

TABLE 2

Comparison of simulated chamber pressure and below-ring pressure for slotted confinement ring and annular ring with 1 inch gap distance from the chamber walls.

| Gas Flow (sccm) | "Set" Pump Pressure (mTorr) | Chamber Pressure (mTorr) Slotted Ring | Chamber Pressure (mTorr) Annular Ring | Below-Ring Pressure (mTorr) Slotted Ring | Below-Ring Pressure (mTorr) Annular Ring |
|---|---|---|---|---|---|
| 2000 | 40 | 58.8 | 54.1 | 43.5 | 44.7 |

Figure 2D:
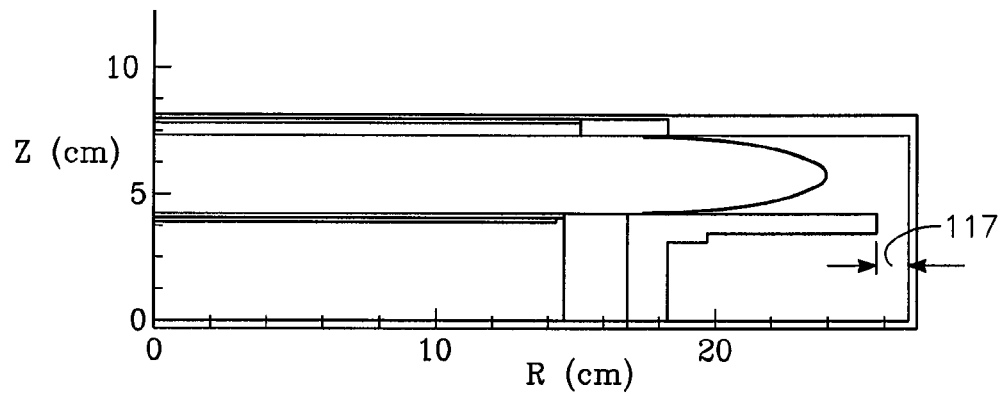
FIG. 2D shows the simulated result of plasma density in the plasma processing chamber when the gap width between the annular ring and the chamber walls is 0.5 inch.
Figure 2E:
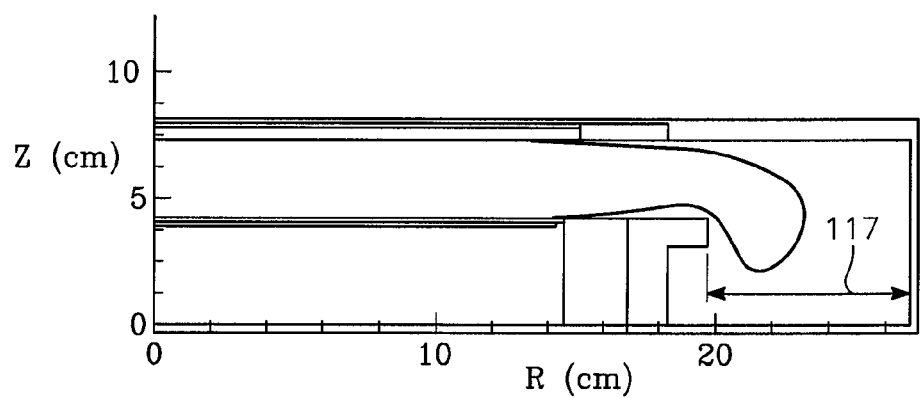
FIG. 2E shows the simulated result of plasma density in the plasma processing chamber when the gap width between the annular ring and the chamber walls is 3 inches.

FIG. 2D shows the simulation results of plasma density in the process chamber when the gap width 117 is 0.5 inch, wherein the plasma density ratio is 0.00013. The horizontal axis corresponds to the distance from the center of the process chamber and the Z-axis corresponds to the distance from 3.9 cm below the top surface of the substrate support 105. The results show that the plasma is relatively confined within the region above the substrate. The chamber pressure is 35.8 mTorr, which is higher than the process specification of $\leq 30$ mTorr. FIG. 2E shows the simulation results of plasma density in the process chamber when the gap width 117 is 3 inch, wherein the plasma density ratio is 0.12. The results show that there is a significant plasma loss to the reactor downstream.

The simulation results in FIG. 2C show that as the gap width 117 increases, the resistance to the flow decreases, hence the wafer pressure decreases. While, with increase in gap width 117, more plasma penetrates downstream the confinement ring, hence, the plasma density ratio increases. In order to keep the chamber pressure $\leq 30$ mTorr, the gap width 117 should be equal to or greater than about 0.8 inch, according to simulation results in FIG. 2C. However, the gap width 117 cannot be too large, since large gap width 117 results in higher plasma loss to the downstream. As described earlier, as the gap width 117 increases beyond 1.5 inch, the effect of the wider gap width 117 in lowering the chamber pressure is not significant; however, the plasma density ratio continues to increase. The plasma density ratio at gap width 117 of 1.5 inch is 0.023, which is reasonably low. Therefore, the gap width 117 should be kept below 1.5 inch.

Magnetic Control of Plasma Radial Distribution:

In one embodiment, radial distribution of plasma ion density is controlled by magnetic steering to enhance the uniformity of the radial plasma ion density distribution and, equivalently, the uniformity of the radial distribution of etch rate across the wafer or workpiece. For this purpose, inner and outer coils 60, 65 depicted in FIG. 1A are placed above the reactor ceiling electrode 125. (An example of such control of radial distribution of plasma ion can be found in U.S. Pat. No. 6,853,141 assigned to the present assignee, which is incorporated by reference herein in its entirety). Each coil 60, 65 is driven by an independent direct current (D.C.) supply 70, 75, respectively. The two D.C. supplies 70, 75 are controlled by a plasma distribution/steering controller 90. The controller may be programmed to drive either one or both supplies 70, 75 simultaneously, with D.C. currents of the same or opposite polarities. The controller 90 may be employed to correct the radial distribution of plasma ion density to improve its uniformity.

The arrangement of the two coils 60, 65 illustrated in FIG. 1A, in which the inner coil 60 is placed at a greater height above the ceiling 125 than the outer coil 65, provides certain advantages. Specifically, the radial component of the magnetic field gradient provided by either coil is, at least roughly, proportional to the radius of the coil and inversely proportional to the axial displacement from the coil. Thus, the inner and outer coils 60, 65 will perform different roles because of their different sizes and displacements: The outer coil 65 will dominate across the entire surface of the wafer 110 because of its greater radius and closer proximity to the wafer 110, while the inner coil 60 will have its greatest effect near the wafer center and can be regarded as a trim coil for finer adjustments or sculpting of the magnetic field. Other arrangements may be possible for realizing such differential control by different coils which are of different radii and placed at different displacements from the plasma. As will be described later in this specification with reference to certain working examples, different changes to the ambient plasma ion density distribution are obtained by selecting not only different magnitudes of the currents flowing in the respective overhead coils (60, 65) but also by selecting different polarities or directions of current flow for the different overhead coils.

Figure 3A:
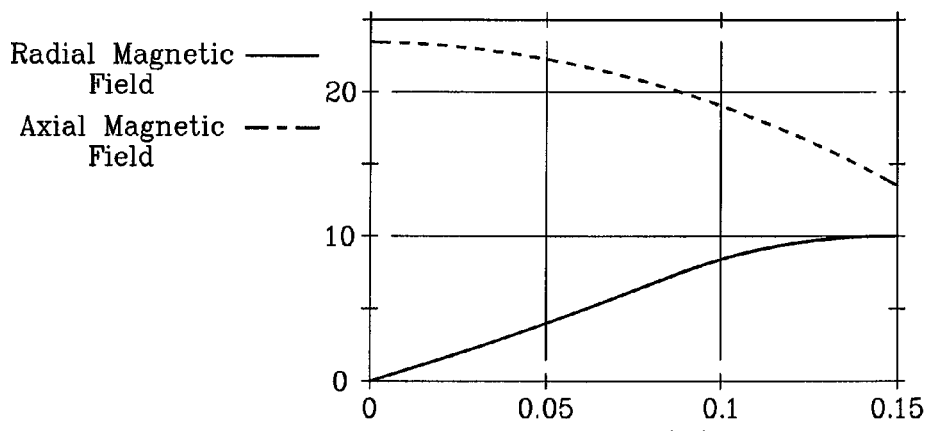
FIGS. 3A and 3B are graphical representations of a magnetic field of the overhead coils of FIG. 1A
Figure 3B:
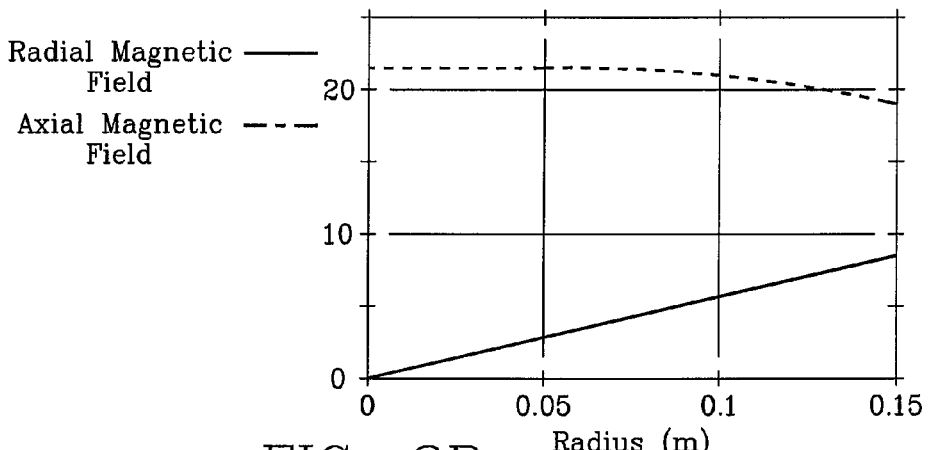
Figure 3C:
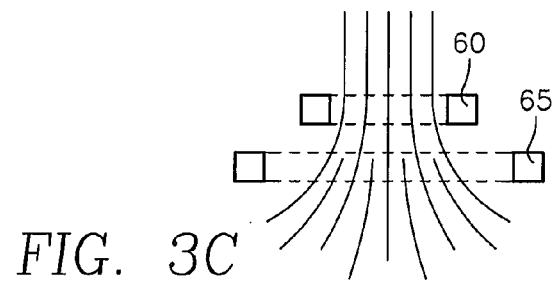
FIG. 3C is a spatial representation of the same field.

FIG. 3A illustrates the radial (solid line) and azimuthal (dashed line) components of the magnetic field produced by the inner coil 60 as a function of radial position on the wafer 110, in the reactor of FIG. 1A. FIG. 3B illustrates the radial (solid line) and azimuthal (dashed line) components of the magnetic field produced by the outer coil 65 as a function of radial position on the wafer 110. The data illustrated in FIGS. 3A and 3B were obtained in an implementation in which the wafer 110 was 300 mm in diameter, the inner coil 60 was 12 inches in diameter and placed about 10 inches above the plasma, and the outer coil 65 was 22 inches in diameter and placed about 6 inches above the plasma. FIG. 3C is a simplified diagram of the half-cusp shaped magnetic field line pattern produced by the inner and outer overhead coils 60, 65.

In one embodiment, the controller 90 of FIG. 1A is provided to change the currents applied to the respective coils 60, 65 in order to adjust the magnetic field at the wafer surface and thereby change the spatial distribution of plasma ion density. In the following examples, the spatial distribution of the etch rate across the wafer surface rather than the plasma ion distribution is measured directly. The etch rate distribution changes directly with changes in the plasma ion distribution and therefore changes in one are reflected by changes in the other.

Figures 4A, 4B:
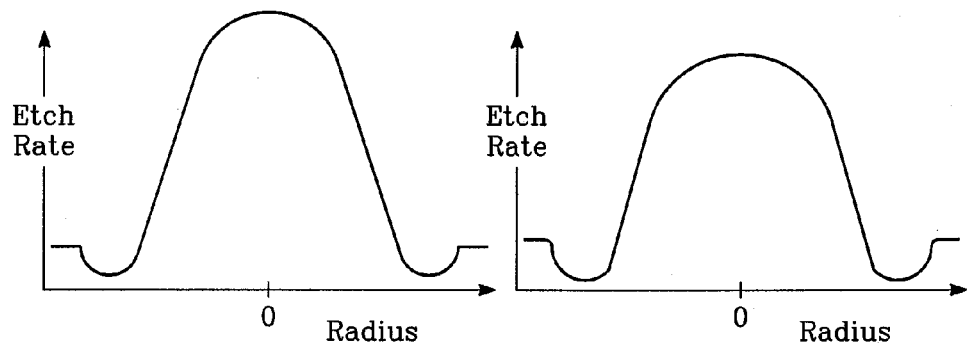
FIGS. 4A, 4B, 4C and 4D are graphs of the etch rate (vertical axis) on the wafer surface as a function of radial location (horizontal axis) for various modes of operation of the reactor of FIG. 1A.

FIGS. 4A, 4B, 4C and 4D illustrate the beneficial effects realized using the inner coil 60 only at a low chamber pressure (30 mT). FIG. 4A illustrates measured etch rate (vertical axis) as a function of location (horizontal axis) on the surface of the wafer 110. FIG. 4A thus illustrates the spatial distribution of the etch rate in the plane of the wafer surface. The center-high non-uniformity of the etch rate distribution is clearly seen in FIG. 4A. FIG. 4A corresponds to the case in which no magnetic field is applied, and therefore illustrates a non-uniform etch rate distribution that is inherent in the reactor and needs correction. The etch rate has a standard deviation of 5.7% in this case. In the following discussion of FIGS. 4A-4D and 5A-5D, the magnetic field strengths that are mentioned correspond to the axial field near the center of the wafer, although it is to be understood that the radial field is the one that works on the radial distribution of plasma ion density to improve uniformity. The axial field is chosen in this description because it is more readily measured. The radial field at the edge of the wafer typically is about one third the axial field at this location.

FIG. 4B illustrates how the etch rate distribution changes when the inner coil 60 has been energized to generate a magnetic field of 9 Gauss. The non-uniformity decreases to a standard deviation of 4.7%.

Figures 4C, 4D:
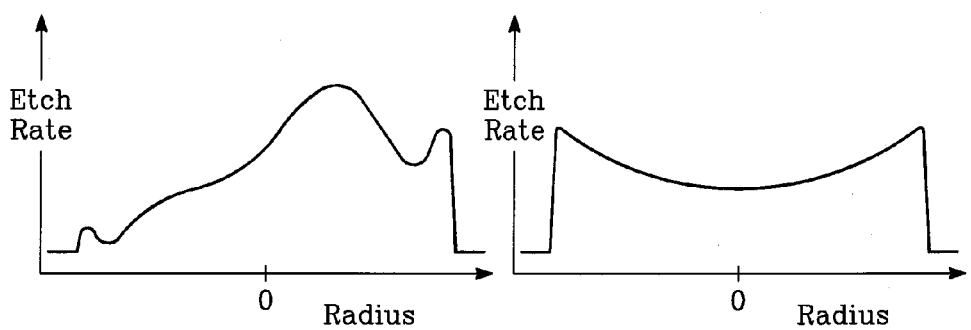

In FIG. 4C the magnetic field of the inner coil 60 has been increased to 18 Gauss, and it can be seen that the peak at the center has been greatly diminished, with the result that the etch rate standard deviation across the wafer is reduced to 2.1%.

In FIG. 4D the magnetic field of the inner coil 60 has been further increased to 27 Gauss, so that the center high pattern of FIG. 4A has been nearly inverted to a center low pattern. The standard deviation of the etch rate across the wafer surface in the case of FIG. 4D was 5.0%.

Figures 5A, 5B:
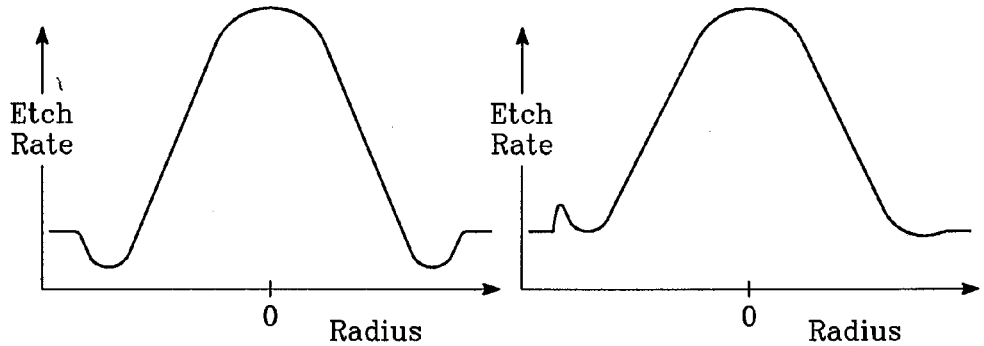
FIGS. 5A, 5B, 5C and 5D are graphs of the etch rate (vertical axis) on the wafer surface as a function of radial location (horizontal axis) for further modes of operation of the reactor of FIG. 1A.

FIGS. 5A, 5B, 5C and 5D illustrate the beneficial effects of using both the coils 60, 65 at higher chamber pressures (200 mT). FIG. 5A corresponds to FIG. 4A and depicts the center-high etch rate non-uniformity of the reactor uncorrected by a magnetic field. In this case, the standard deviation of the etch rate across the wafer surface was 5.2%.

In FIG. 5B, the outer coil 65 has been energized to produce a 22 Gauss magnetic field, which decreases somewhat the center peak in the etch rate distribution. In this case, the etch rate standard deviation has been decreased to 3.5%.

Figures 5C, 5D:
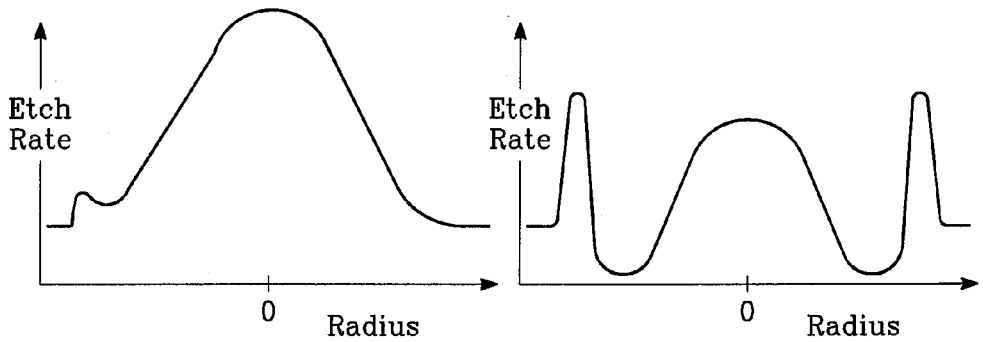

In FIG. 5C, both coils 60, 65 are energized to produce a 24 Gauss magnetic field. The result seen in FIG. 5C is that the center peak in the etch rate distribution has been significantly decreased, while the etch rate near the periphery has increased. The overall effect is a more uniform etch rate distribution with a low standard deviation of 3.2%.

In FIG. 5D, both coils are energized to produce a 40 Gauss magnetic field, producing an over-correction, so that the etch rate distribution across the wafer surface has been transformed to a center-low edge-high distribution. The etch rate standard deviation in this latter case has risen slightly (relative to the case of FIG. 5C) to 3.5%.

Comparing the results obtained in the low pressure tests of FIGS. 4A-4D with the high pressure tests of FIGS. 5A-5D, it is seen that the higher chamber pressure requires a much greater magnetic field to achieve a similar correction to etch rate non-uniform distribution. For example, at 30 mT an optimum correction was obtained using only the inner coil 60 at 18 Gauss, whereas at 300 mT a magnetic field of 24 Gauss using both coils 60, 65 was required to achieve an optimum correction.

Magnetic control of plasma distribution or magnetic enhancement of plasma uniformity through activation of either or both of the two coils 60, 65 may cause the plasma ion density to increase at the periphery or edge of the wafer or workpiece. For example, for a center-high distribution of plasma ion density (or, equivalently, a center-high distribution of etch rate), the magnetic control is capable of improving overall uniformity by reducing the plasma ion density at the wafer center. However, this improvement in uniformity is limited because the plasma ion density is increased at the wafer edge due to the tendency of the magnetic plasma distribution control to produce an edge-high plasma distribution.

Figure 6A:
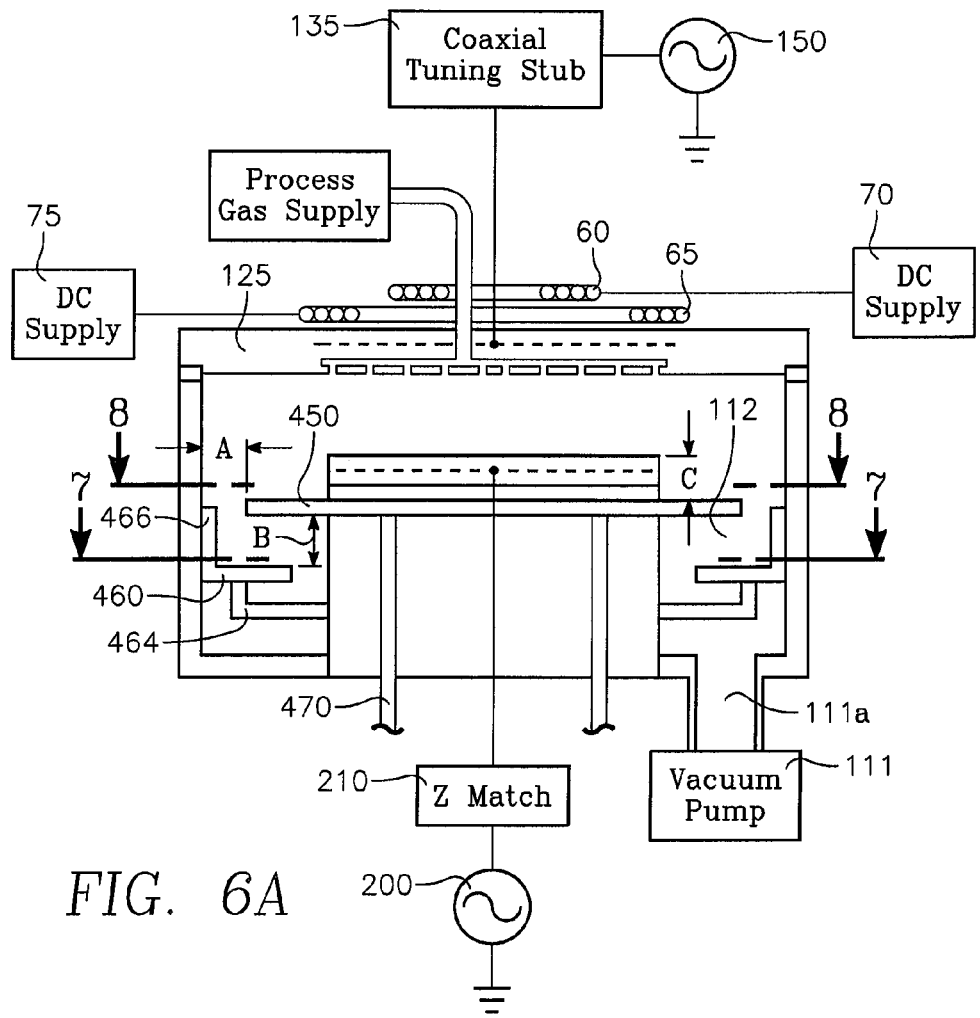
FIG. 6A is a simplified schematic view of the reactor of FIG. 1A depicting an improved baffle for axial confinement of the plasma and a flow equalizer for compensating for the asymmetrical gas flow pattern to the pumping port.

In accordance with one aspect of the present invention, a conductive baffle 450 depicted in FIG. 6A and also in FIG. 1A is provided. The conductive baffle 450 is placed below the plane of the wafer 110. The conductive baffle 450 is configured to improve plasma uniformity and/or provide plasma confinement across the workpiece. In the reactor of FIG. 6A, the below-plane baffle 450 replaces the annular ring 115 of FIG. 2A. The baffle 450 may be formed of a conductive (or semi-conductive) material, one example being anodized aluminum, or, alternatively, silicon carbide, for example, although this aspect is not limited to any particular material. The baffle 450 is grounded to the conductive base 5505 of the pedestal 105. We have discovered that by placing the baffle 450 below the wafer plane, the electric field created by the VHF source power applied to the overhead electrode 125 is reduced in the vicinity of the wafer periphery. The result is that the plasma ion density is reduced in the region of the wafer periphery. The advantage is that the tendency of the magnetic control or plasma steering exerted by the coils 60, 65 to undesirably increase plasma ion density at the wafer periphery is offset or compensated by the depression of periphery ion density by the below-plane baffle 450. The baffle 450 is depressed below the wafer plane by a sufficient distance to adequately compensate for the edge-high tendency of the magnetic plasma steering. This will be explained in greater detail below.

Figure 6B:
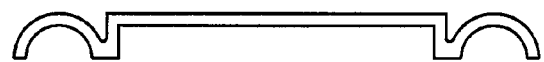
FIG. 6B is a cross-sectional view of another embodiment of the improved baffle.
Figure 6C:
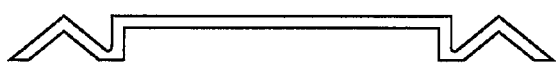
FIG. 6C is a cross-sectional view of yet another embodiment of the improved baffle.
Figure 7:
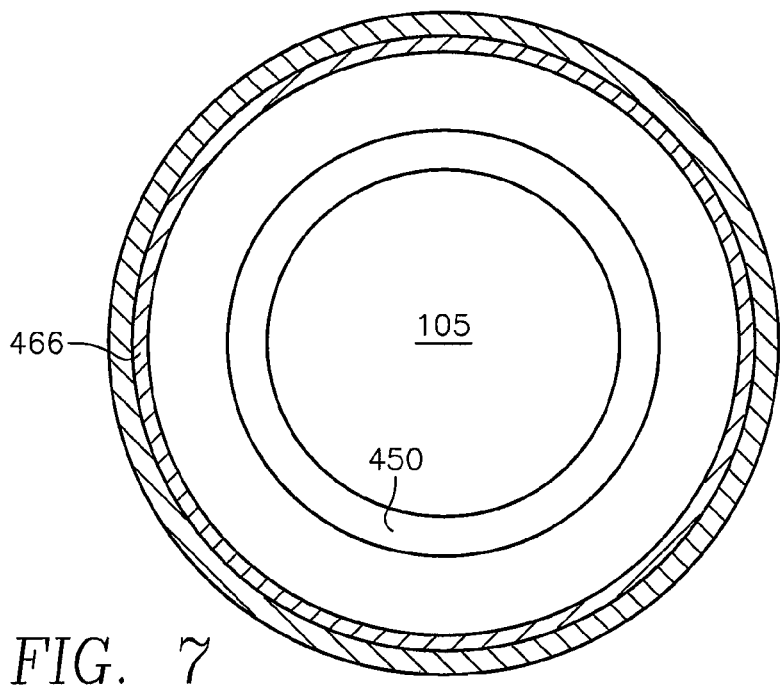
FIG. 7 is another plan cross-sectional view of the reactor of FIG. 1A showing the baffle.

FIG. 6B depicts an alternative version of the baffle 450 in which the median portion of the annular baffle 450 between its inner and outer radii is raised to or slightly above the wafer plane, the remaining portions of the baffle 450 of FIG. 6B being below the wafer plane. FIG. 6C depicts a triangular version of the embodiment of FIG. 6B. In FIGS. 6A, 6B and 6C, the distance between the peripheral edge of the baffle 450 and the sidewall of the chamber is determined in the same manner as described above for the distance 117 between the edge of the ring 115 and the sidewall. A plan view of the baffle 450 as installed in the reactor of FIG. 1A is shown in FIG. 7.

Figure 8:
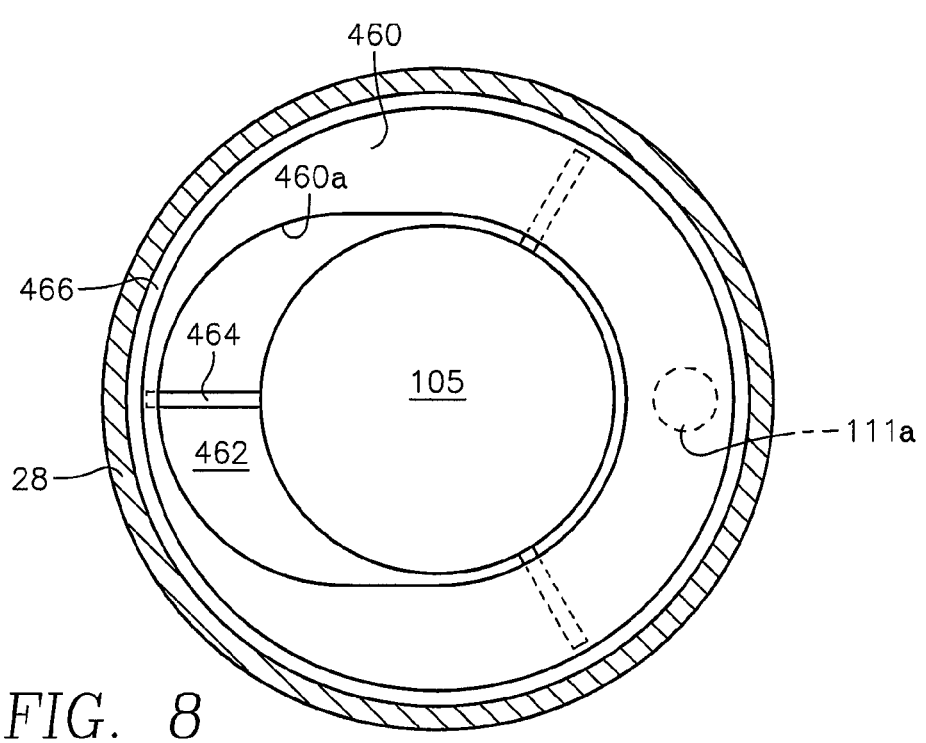
FIG. 8 is a plan cross-sectional view of the reactor of FIG. 1A showing the structure of the flow equalizer.

Embodiments of the present invention further reduce or eliminate the asymmetrical gas flow pattern across the wafer that may be associated with the single pumping port 111a at the input to the pump 111. Gas flow across the wafer edge nearest the port 111a is fast, while gas flow across the wafer edge portion that is furthest from the port 111a is slow, and this difference may introduce further non-uniformities in the etch rate distribution across the wafer 110. In one embodiment, an annular gas flow equalizer 460 is provided. The annular gas flow equalizer 460 placed within the pumping annulus 112 is provided to eliminate or reduce the non-uniformity. Referring to FIG. 8, the equalizer 460 has an eccentric shape to form an eccentric annular opening 462 whose inner radius is the cathode 105 and whose radially outer limit is determined by the eccentric inner edge 460a of the equalizer 460. The opening 462 has the greatest area on the side of the cathode 105 opposite the pumping port 111a and has the least area closest to the port 111a. The eccentricity of the opening 462 creates a gas flow resistance whose distribution is analogous to a mirror opposite of the asymmetry of the gas flow that exists in the absence of the equalizer 460. As a result, the gas flow across the edge of the wafer is uniform around the entire periphery of the wafer 110. In one aspect, the flow equalizer 460 is formed of an electrically conductive material such as anodized aluminum.

In one embodiment, the equalizer 460 is supported by plural (e.g., three) elongate radial struts 464 extending from the cathode 105. The equalizer 460 supports a vertical wall 466 extending upwardly from the edge of the equalizer 460. In FIG. 6A, the horizontal distance A between the edge of the baffle 450 and the vertical wall 466 and the vertical distance B between the baffle 450 and the equalizer 460 are selected to impose only a negligible resistance to gas flow to the pumping port 111. The distance C by which the baffle 450 is depressed below the wafer plane is chosen to compensate for the tendency of the magnetic plasma steering control to raise the local plasma density at the wafer edge. In one aspect, the struts 464 are conductive, and the electrically conductive flow equalizer 460 is electrically coupled through the struts 464 to the grounded conductive base 5505 of the pedestal 105.

Figure 9A:
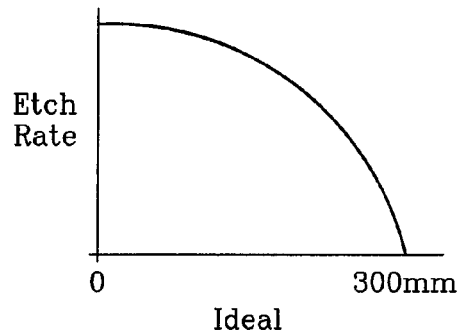
FIGS. 9A and 9B are graphs of an ideal radial etch rate distribution for magnetic enhancement of radial uniformity before magnetic enhancement and after magnetic enhancement, respectively.
Figure 9B:
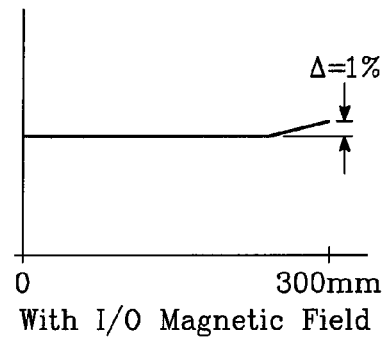

FIG. 9A depicts a center-high etch rate distribution that decreases at a constantly increasing rate with radius. FIG. 9B is a graph depicting the effect of the magnetic steering apparatus 60, 65 in improving (correcting) plasma density distribution uniformity. The magnetic steering by the coils 60, 65 forces the plasma distribution to become nearly flat (uniform), with only a slight upward deviation at the radial edge of the wafer, as depicted in FIG. 9B. This deviation is slight (about 1%) and therefore acceptable. Uncorrected plasma ion density distribution of a typical reactor such as that of FIG. 1A is not as ideal as depicted in FIG. 9A.

Figure 10A:
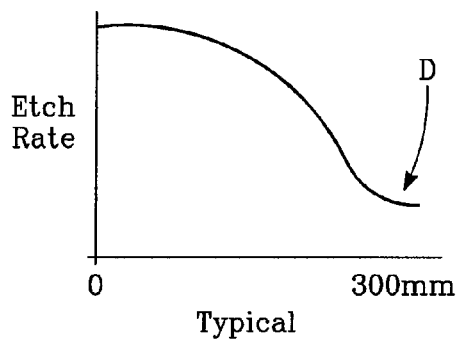
FIGS. 10A and 10B are graphs of a radial etch rate distribution typical of the reactor of FIG. 1A before magnetic enhancement and after magnetic enhancement, respectively.
Figure 10B:
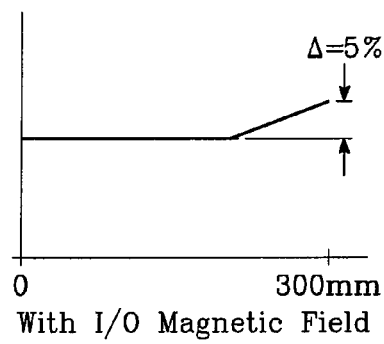
Figure 11A:
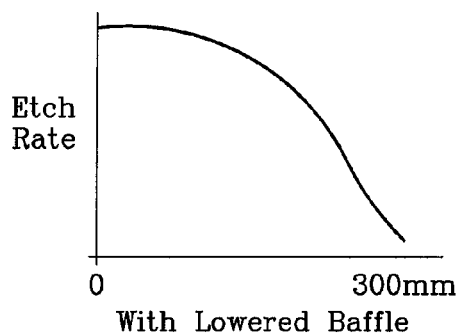
FIGS. 11A and 11B are graphs of radial etch rate distribution in the reactor of FIG. 1A with the improved baffle of the present invention before magnetic enhancement and after magnetic enhancement, respectively.
Figure 11B:
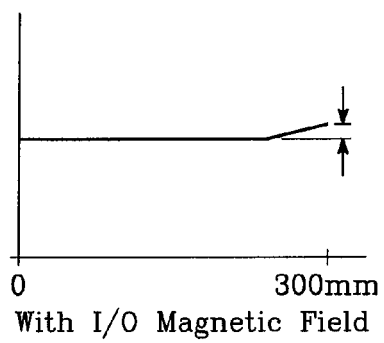

FIG. 10A depicts a center-high etch rate distribution of the type actually encountered in the reactor of FIG. 2A having the plasma confinement ring 115 in the plane of the wafer 110. The ring 115 reduces the plasma volume in the vicinity of the wafer periphery and thereby increases the plasma ion density at the wafer periphery. The resulting uncorrected etch rate distribution of FIG. 10A does not decrease at a constantly increasing rate near the wafer periphery, but instead has a nearly level region D at the wafer periphery. Upon correction by the magnetic steering coils 60, 65, the overall distribution (FIG. 10B) is more uniform, while the etch rate distribution exhibits a significant rise (e.g., 5% or 10%) at the wafer periphery, as shown in the graph of FIG. 10B, due to the tendency of the magnetic steering to increase plasma density at the wafer periphery when correcting a center-high distribution. This rise, or edge high plasma ion distribution tendency, is undesirable and limits the maximum uniformity that the magnetic steering can achieve. Upon replacement of the annular ring 115 with the below-wafer plane baffle 450 of FIG. 6A, the uncorrected etch rate distribution has a nearly constant rate of decrease with radius even out to the wafer periphery, as shown in the graph of FIG. 11A. When this distribution is corrected by activating the magnetic steering coils 60, 65, there is very little rise in the etch rate distribution at the wafer periphery, as indicated in FIG. 11B. The overall uniformity that can be achieved with magnetic steering of the plasma is improved.

Figure 12:
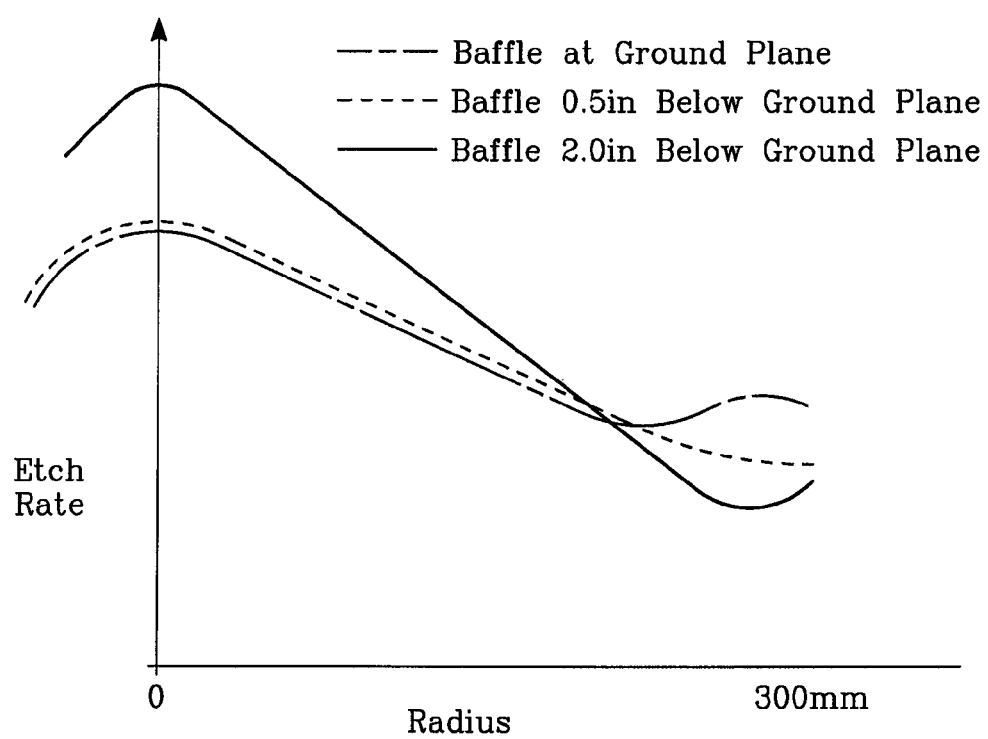
FIG. 12 is a graph comparing the etch rate distributions attained in the reactor of FIG. 1A for different heights of the baffle below the wafer plane.

In one embodiment, the distance C (FIG. 6A) by which the baffle 450 is depressed below the wafer plane is determined. FIG. 12 is a graph illustrating the radial distribution of etch rate across the wafer for three different heights of the baffle 450. The long-dashed line depicts the etch rate distribution using the ring 115 of FIG. 2A, which is at the plane of the wafer 110. The dashed line distribution is similar to the distribution of FIG. 10A. The short-dashed line depicts etch rate distribution using the baffle 450 depressed about 0.5 inch below the plane of the wafer 110. This case represents a more uniform rate of decrease of the etch rate with radius. The solid line depicts etch rate distribution in which the baffle 450 is depressed one inch below the plane of the wafer 110. This latter case exhibits the greatest suppression of etch rate at the wafer periphery and most nearly approaches the ideal case of FIG. 9A or the best practical case of FIG. 11A. The foregoing comparison indicates that depressing the baffle 450 about 1 inch below the wafer plane provides superior results. The optimum level of the baffle depends upon the magnitude of the magnetic steering or radial distribution correction applied through the coils 60 and/or 65, which in turn depends upon the uncorrected plasma ion density radial distribution. These may all vary from process to process, so that the optimum elevation of the baffle may be different for different processes. Therefore, in another aspect, the height of the baffle 450 relative to the plane of the wafer 110 may be adjustable by an elevator mechanism 470 indicated schematically in FIG. 6A.

Impedance Confinement of the Plasma:

In one embodiment, radial confinement of the plasma is achieved by employing impedance confinement, which includes lowering the top electrode voltage to reduce voltage drop between the top electrode 125 and chamber walls 128. Typically, the VHF source power is mainly supplied through the top electrode 125 at a VHF source voltage, $V_s$. In carrying out impedance confinement, the top electrode voltage is reduced to a fraction, f, of the source voltage, i.e., $fV_s$, where f is a number less than one. The voltage at the cathode is changed to the complementary voltage of $-(1-f)V_s$, so that the electrode-to-cathode voltage remains at the total source power voltage of $V_s$, so that plasma ion density is not compromised. (It will be remembered that the cathode comprises the substrate support 105 and the wafer 110 during substrate processing. When the wafer 110 is not present in the chamber during processing, the substrate support 105 forms the cathode.) Thus, the voltage difference between the top electrode 125 and the cathode is kept at the VHF source voltage, $V_s$, but the voltage difference between the top electrode 125 and the grounded chamber walls 128 is advantageously reduced to $fV_s$. This reduction in voltage difference between the top electrode 125 and the grounded chamber side wall 128 reduces the amount of plasma generated near the side wall 128 and therefore at the wafer periphery. The way to supply the source power at a lower top electrode voltage, $fV_s$, and to maintain the cathode at a negative phase from the top electrode at $-(1-f)V_s$ is by adjusting the impedance of chamber components associated with the top electrode 125, the cathode (i.e., the combination of the pedestal 105 with the wafer 110) and the side wall 128.

Figure 13A:
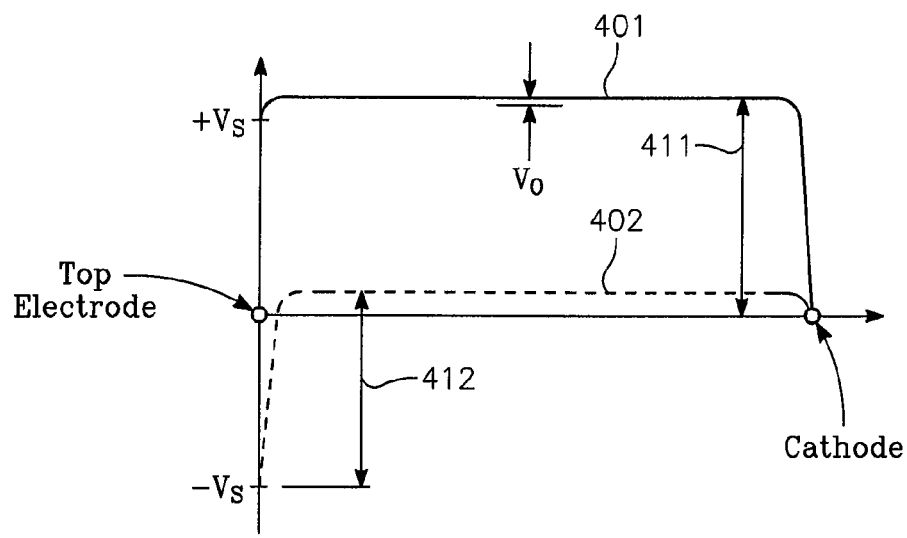
FIG. 13A shows the voltage between the top electrode and the grounded cathode when the voltage ratio is 1 (or source voltage fully supplied at top electrode).
Figure 13B:
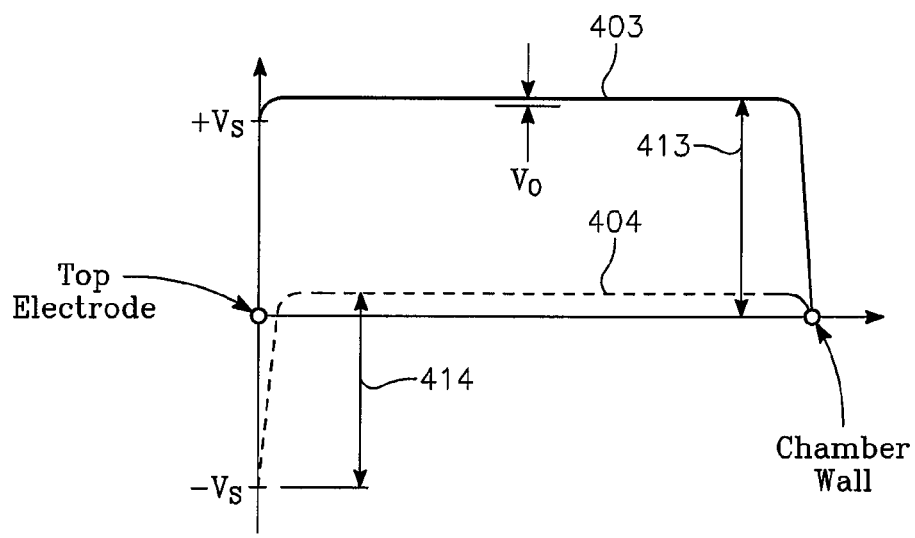
FIG. 13B shows the voltage between the top electrode and the grounded chamber wall when the voltage ratio is 1 (or source voltage fully supplied at top electrode).

In one embodiment, the impedances of the chamber components are adjusted so as to achieve the foregoing anode and cathode voltages of $fV_s$ and $-(1-f)V_s$, respectively, as described below. FIG. 13A shows the relative voltage values of top electrode 125 (or source) and cathode (substrate support 105 along with the wafer 110 during substrate processing), which is grounded. FIG. 13B shows the relative voltage values of top electrode 125 and the grounded chamber wall 128. The horizontal axis in FIG. 13A represents the space between the top electrode 125 and the cathode. The horizontal axis in FIG. 13B represents the space between the top electrode 125 and the grounded chamber wall 128. The distances of the horizontal axes are not drawn to scale. The top electrode voltage oscillates at the source power VHF frequency between $+V_s$ and $-V_s$, while cathode and chamber walls stay at 0 (ground). The bulk of the plasma has a voltage that is higher than the top electrode by $V_o$, which is much smaller than $V_s$. Curve 401 represents the voltage between the top electrode 125 and cathode, which is formed by the substrate support 105 and the wafer 110 during substrate processing, when the top electrode voltage is at $+V_s$. The voltage difference 411 between the top electrode 125 and the cathode, when the top electrode voltage is at $+V_s$, equals $V_s$. Dashed curve 402 represents the voltage between the source and the cathode when the source voltage is at $-V_s$. The voltage difference 412 between the top electrode 125 and the cathode, when the top electrode 125 voltage is at $-V_s$, equals $-V_s$.

Similarly in FIG. 13B, curve 403 represents the voltage between the source and chamber walls when the top electrode 125 voltage is at $+V_s$. The voltage difference 413 between the top electrode 125 and the chamber walls 128, when the top electrode voltage is at $+V_s$, equals $V_s$. Dashed curve 404 represents the voltage between the top electrode 125 and the chamber walls 128 when the source voltage is at $-V_s$. The voltage difference 414 between the top electrode 125 and the chamber walls 128, when the top electrode voltage is at $-V_s$, equals $-V_s$.

Figure 13C:
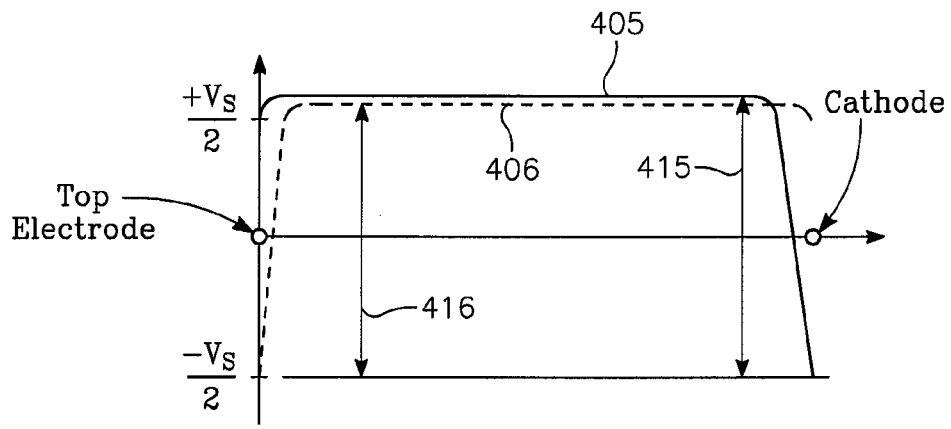
FIG. 13C shows the voltage between the top electrode and the cathode when the voltage ratio is 0.5 (or half of source voltage is supplied at top electrode).

By tuning the impedance of the substrate support 105 and the impedance of the dielectric seal 130, according to a manner described below, the source voltage supplied to the top electrode can be reduced to a fraction of the total source voltage, such as half ($V_s/2$), while the cathode voltage is maintained at a negative phase of the top electrode to make up the difference, such as $-V_s/2$. In essence, the capacitances to ground of the anode electrode 125 and of the cathode, respectively, are separately adjusted to introduce a 180 degree phase shift between the VHF voltages on the anode 125 and cathode, respectively. The capacitance to ground of the cathode, thus modified, permits the cathode voltage to oscillate at the VHF frequency in opposing phase to the anode electrode 125. The plasma ion density is not compromised so that the process does not change, since the total voltage difference between the source and cathode remains $V_s$ and $-V_s$ at respective half-cycle peaks of the VHF source voltage. FIG. 13C shows the voltage along the space between top electrode 125 and the cathode. The top electrode voltage oscillates between $+V_s/2$ and $-V_s/2$, while cathode voltage oscillates between $-V_s/2$ and $+V_s/2$ correspondingly. Curve 405 represents the voltage along the axis between the electrode and cathode when the top electrode voltage is at $+V_s/2$. The voltage difference 415 between the top electrode 125 and cathode 105, 110, when the top electrode 125 voltage is at $+V_s/2$, equals $V_s$. Dashed curve 406 represents the voltage along the axis between the top electrode 125 and the cathode when the source voltage is at $-V_s/2$. The voltage difference 416 between the top electrode 125 and the cathode, when the source voltage is at $-V_s/2$, equals $-V_s$.

Figure 13D:
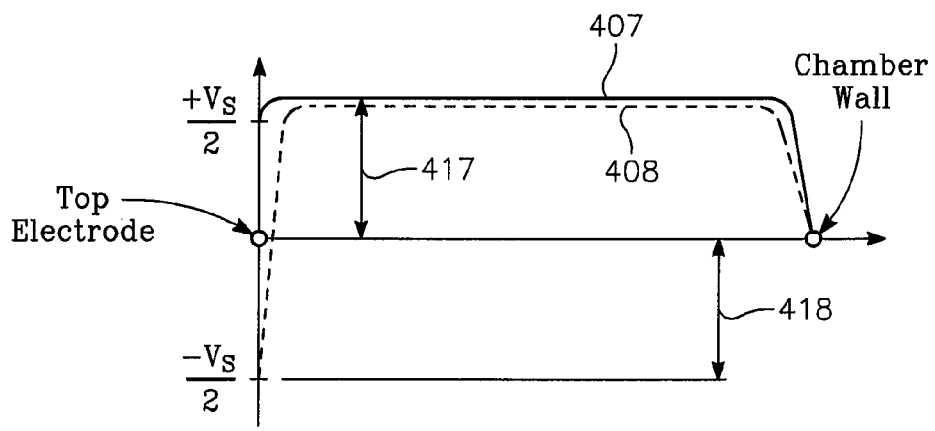
FIG. 13D shows the voltage between the top electrode and the grounded chamber wall when the voltage ratio is 0.5 (or half of source voltage is supplied at top electrode).

In FIG. 13D, curve 407 represents the voltage between the top electrode 125 and the grounded chamber wall 128 when the top electrode voltage is at $+V_s/2$. The voltage difference 417 between the top electrode and chamber walls (grounded), when the top electrode voltage is at $+V_s/2$, is $V_s/2$. Dashed curve 408 represents the voltage between the top electrode and the chamber walls when the top electrode voltage is at $-V_s/2$. The voltage difference 418 between the top electrode and the chamber walls, when the top electrode voltage is at $-V_s/2$, equals $-V_s/2$. As will be explained below, these results are achieved by tuning the impedance (capacitance) of the anode electrode 125 to ground and tuning the impedance (capacitance) of the cathode to ground in such a way as to achieve a desired value of the fraction f. In the foregoing examples, f was one-half, in which case the voltage difference between the top electrode 125 and the chamber wall 128 was reduced to half of the source power voltage $V_s$. Since the voltage difference between the top electrode and the cathode is larger ($V_s$) than the voltage difference between the top electrode and the chamber walls ($V_s/2$), there is less plasma ion generation near the side walls, and therefore the plasma is more confined in the region between the top electrode 125 and the cathode and away from the chamber side wall 128.

In addition, by reducing the anode-to-wall voltage difference by the fraction f (e.g., one-half), the amount of power that could be lost due to un-confined plasma is reduced by $f^2$ (e.g., ¼). Equation 1 below shows the relationship between P (power) and voltage difference between the top electrode to the chamber walls when the top electrode voltage is $V_s$:

$$P \sim (V_s)^2 = V_s^2 \quad (1)$$

The equation 2 below shows the relationship between P (power) and voltage difference between the top electrode to the chamber walls when the top electrode voltage is only $V_s/2$.

$$P \sim (V_s/2)^2 = V_s^2/4 \quad (2)$$

By reducing the top electrode voltage by a factor of two, the power available to lose to the chamber wall is reduced by a factor of four.

Figure 14A:
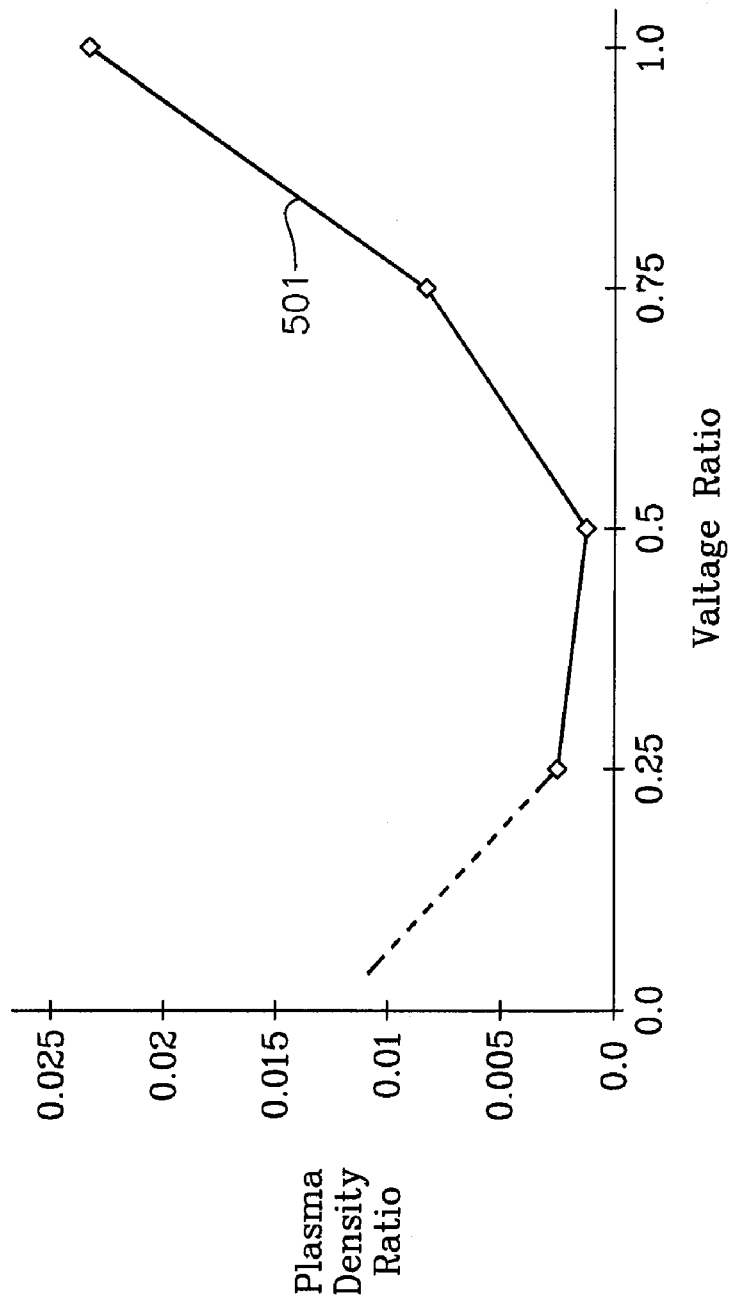
FIG. 14A shows the simulated plasma density ratio as a function of voltage ratio.

Reducing the top electrode voltage by a voltage ratio f, and supplying the difference $(1-f)V_s$ at a negative phase to the cathode 105, 110 reduces the amount of plasma present at the grounded side wall 128, and thus improves plasma confinement. This method of plasma confinement is referred to in this specification as impedance confinement. The fraction of total source voltage used in the discussion above is ½; however, other fraction values can also be used and could also improve plasma confinement. The fraction of source voltage supplied at the top electrode can also be defined as "voltage ratio". FIG. 14A is a graph of plasma density simulation results for voltage ratios of 1, 0.75, 0.5 and 0.25. The pressure at the pump entry of the simulation process is 10 mTorr and the total source power is 1.85 kW. The spacing between the annular confinement ring 115 with the inner chamber wall simulated is 1.5 inch (or 3.8 cm). Curve 501 shows that as the voltage ratio decreases from 1, the plasma density ratio is reduced. The plasma density ratio of 0.001 is lowest when the voltage ratio is at 0.5. However, plasma density ratio of 0.003 when the voltage ratio is at 0.25 and plasma density ratio of 0.008 when the voltage ratio is at 0.75 are both lower than the plasma density ratio when the voltage ratio is 1.

Figure 14B:
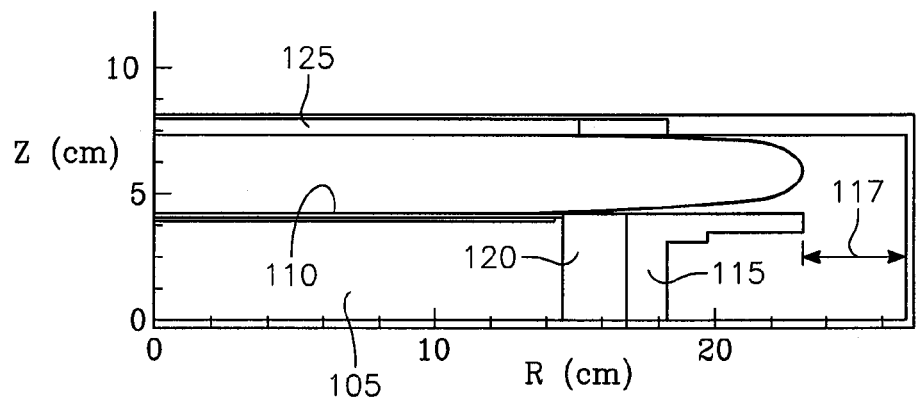
FIG. 14B shows the simulated result of plasma density in the plasma processing chamber when the gap width between the annular ring and the chamber walls is 1.5 inch and the voltage ratio is 1.
Figure 14C:
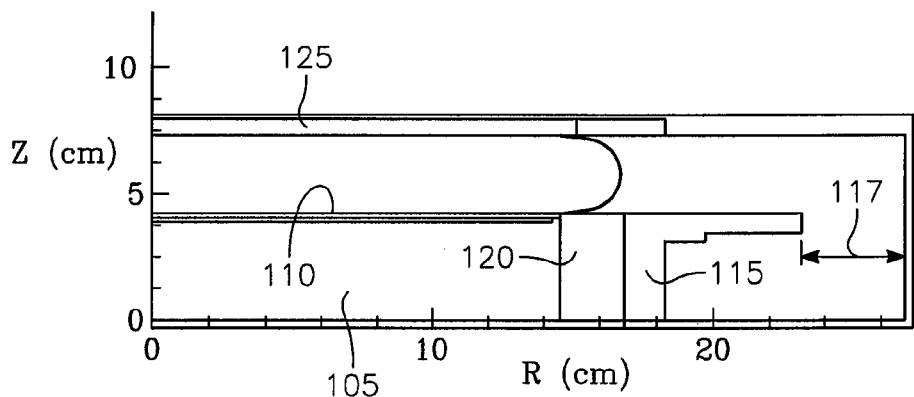
FIG. 14C shows the simulated result of plasma density in the plasma processing chamber when the gap width between the annular ring and the chamber walls is 1.5 inch and the voltage ratio is 0.5.

FIG. 14B shows the simulation result of plasma density of 0.023 in the process chamber when the voltage ratio is 1 (or source voltage is completely supplied at top electrode). The simulation results show significant amount of plasma are outside the region above the substrate. FIG. 14C shows the simulation result when the voltage ratio is reduced to 0.5. The results show that plasma is mostly confined near the region above the substrate surface. Referring back to FIG. 2B, with gap width of 1.5 in, the pressure of the chamber can be maintained at about 26.2 mTorr, which is below 30 mTorr as targeted. According to FIG. 14A, to achieve the same plasma confinement results as the slotted confinement ring, which achieves plasma density ratio of 0.004, the voltage ratio can be operated between about 0.2 to about 0.6. However, when plasma density ratio is $\leqq 0.01$, the plasma confinement is considered quite reasonable. Therefore, the voltage ratio could be operated between about 0.1 to about 0.75, according to simulation results in FIG. 14A.

The combined usage of the annular plasma confinement ring and impedance confinement achieves good plasma confinement and lower chamber pressure as desired for the front end processes with a wide process window. The annular ring gap width 117 could be between about 0.8 inch to about 1.5 inch and the voltage ratio for impedance confinement could be between about 0.1 to about 0.75 and preferably between about 0.2 to about 0.6.

Figure 14D:
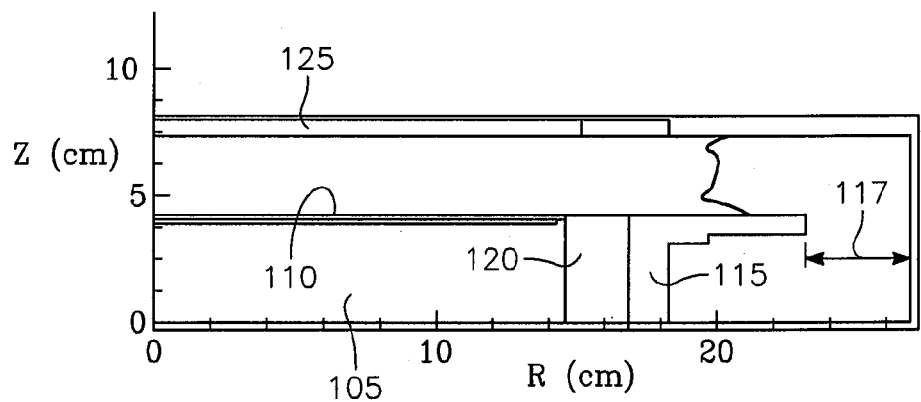
FIG. 14D shows the simulated result of power deposition in the plasma processing chamber when the gap width between the annular ring and the chamber walls is 1.5 inch and the voltage ratio is 1.
Figure 14E:
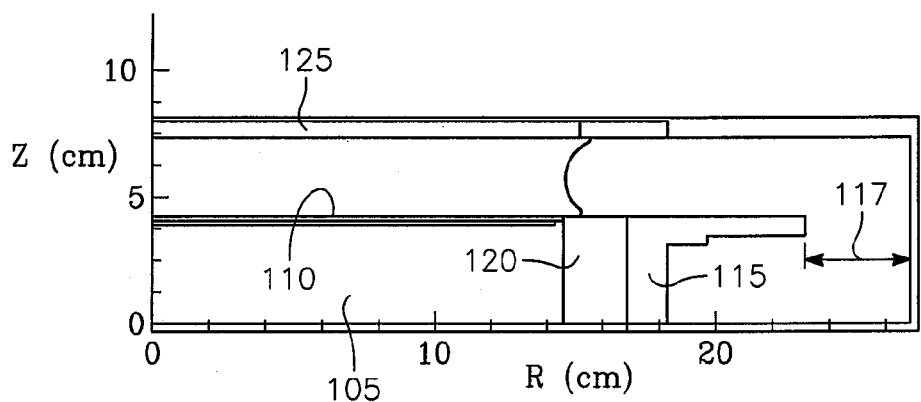
FIG. 14E shows the simulated result of power deposition in the plasma processing chamber when the gap width between the annular ring and the chamber walls is 1.5 inch and the voltage ratio is 0.5.

In addition to plasma confinement improvement, lowering the voltage ratio also reduces the power loss outside the process region. FIG. 14D shows the simulation results of power deposition, which is defined as power per volume or power density, in the process chamber when the voltage ratio is maintained at 1. The results show significant power deposition outside the process region, which is above the substrate surface or the region within 15 cm from the center of the reactor. In contrast, FIG. 14E shows the power deposition of the process chamber when the voltage ratio is 0.5. The power loss outside the process region is much reduced, compared to FIG. 14D.

Figure 15:
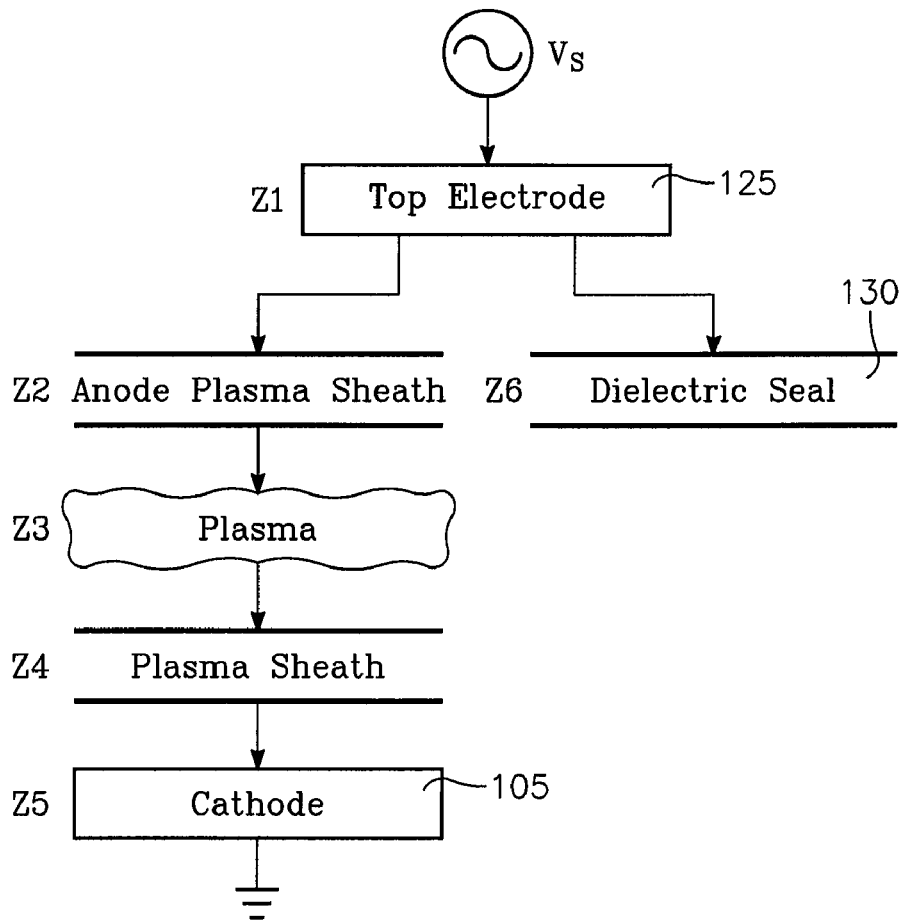
FIG. 15 shows a circuit drawing between the top electrode, the cathode and the chamber walls.

FIG. 15 is a simplified schematic diagram representing the impedance components of the reactor 100 of FIG. 1A or FIG. 6, showing the overhead electrode 125, which has an impedance to ground of $Z_1$. The electrode 125 is connected to the dielectric seal 130, which acts like a capacitor and has an impedance to ground of $Z_6$.

The cathode is formed by the substrate support 105, which has dielectric layers 5520 and 5510, and the wafer 110 during substrate processing, and the cathode has an impedance to ground of $Z_5$. If the wafer 110 is not present during processing, the substrate support 105 alone acts as the cathode. In addition to the overhead electrode 125 impedance $Z_1$ and cathode impedance $Z_5$, the bulk plasma also has impedance $Z_3$. In addition, there is an anode plasma sheath represented by an equivalent capacitor with impedance $Z_2$ in series between the electrode impedance $Z_1$ and the bulk plasma impedance $Z_3$. Furthermore, a cathode plasma sheath is represented by an equivalent capacitor with impedance $Z_4$ in series between the bulk plasma impedance $Z_3$ and the cathode impedance $Z_5$.

Equation 1 shows the relationship between impedance (Z), resistance (R) and capacitance reactance ($X_c$). "j" in equation 1 is an imaginary number.

$$Z=R-jX_c \quad (1)$$

Equation 2 shows the relationship between the capacitance reactance ($X_c$) and capacitance C.

$$X_c=1/(2\pi fC) \quad (2)$$

where f is the frequency of the source power and C is the capacitance.

FIG. 15 is a simplified schematic diagram of an equivalent circuit, in which the top electrode 125, anode plasma sheath, plasma, cathode plasma sheath and cathode are in serial and these impedance components are in parallel with the dielectric serial 130. Equation 3 shows the total impedance, $Z_{total}$.

$$Z_{total}=Z_1+1/(1/(Z_2+Z_3+Z_4+Z_5)+1/Z_6) \quad (3)$$

Figure 16:
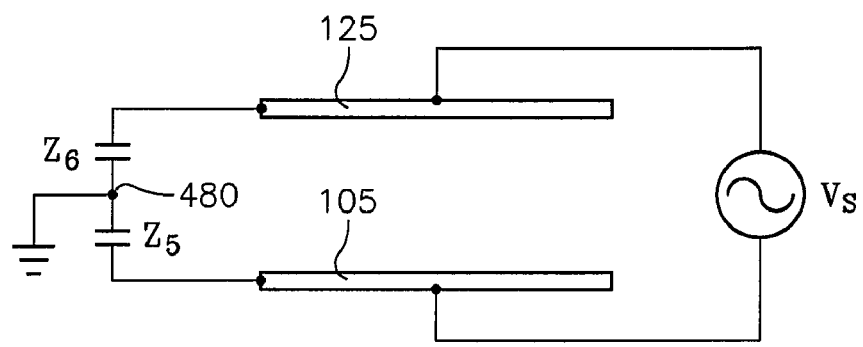
FIG. 16 is a simplified schematic diagram depicting a tutorial model of the circuit for carrying out the impedance confinement method.

Since the top electrode is typically made of conductive material, its impedance $Z_1$ is mainly made of the resistance of the top electrode. $Z_2$, $Z_3$ and $Z_4$ are affected by the plasma. However, impedance Z5 and Z6 can be adjusted by changing the thicknesses and dielectric constants of the dielectric layers of the substrate support 105, and the dielectric seal 130. The magnitude of the cathode impedance can be affected the cathode capacitance. Z5 and Z6 can be adjusted to allow supplying the top electrode 125 at a fraction of conventional source voltage, $fV_s$, and maintaining the cathode at a voltage of negative phase from the top electrode, $-(1-f)V_s$. The cathode impedance Z5 and the anode impedance Z6 are adjusted to introduce a desired phase shift between the VHF voltages at the anode 125 and cathode 105/110 to achieve the desired fraction, f. The selection or adjustment of the anode impedance may be made by selecting the dielectric constant and thickness of insulator ring 130, for example. The selection or adjustment of the cathode impedance may be made by selecting the dielectric constant and thickness of the insulator layer 5510, for example. In the foregoing examples, f=0.5 and the phase shift required would have been about 180 degrees. The situation is conceptually depicted in the highly simplified schematic diagram of FIG. 16, in which the adjustable anode and cathode impedances Z5 and Z6 are modeled as capacitances to ground of the electrode 125 and of the cathode 105, respectively, the capacitors Z5, Z6 being connected to ground at a center tap point 480. In the figurative circuit of FIG. 16, the anode and cathode float relative to ground with their voltage difference being split across ground due to the grounded center tap 480. The fraction f is determined by the different impedances of the two capacitors Z5 and Z6, which are readily chosen by the skilled worker to achieve the desired fractional value f in accordance with the foregoing novel teachings.

The presence of a plasma confinement ring 115 such as that depicted in FIG. 2A may reduce the ability of the foregoing impedance confinement method to actually confine the plasma away from the chamber side wall 128. This is because the presence of the wafer-plane confinement ring 115 actually promotes plasma ion density at the periphery and near the side wall 128.

Figure 17:
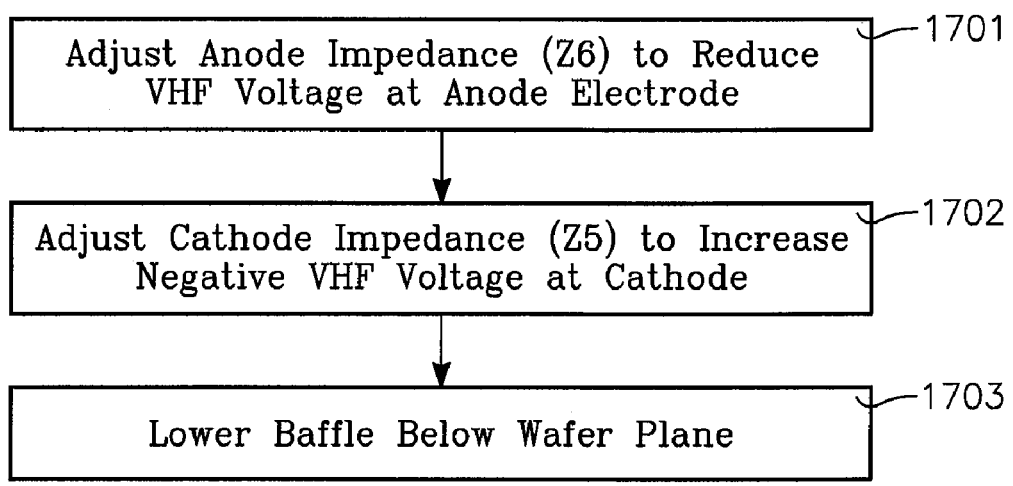
FIG. 17 is a diagram depicting a method in which impedance confinement of radial extent of the plasma is enhanced by the improved baffle.

An embodiment of the impedance confinement method of FIGS. 13-16 may be carried out by replacing the wafer-plane confinement ring 115 of FIG. 2A with the below-wafer plane plasma confinement baffle 450 of FIG. 6. The extent to which the baffle 450 is depressed below the plane of the wafer 110 enhances the confinement of the plasma away from the side wall 128 by the impedance confinement method of FIGS. 13-16. Therefore, in one aspect of the invention, the below-wafer plane baffle is combined with the impedance confinement of FIGS. 13-16. This aspect is depicted in FIG. 17, in which a method is carried out by first adjusting the anode impedance to ground Z6 (block 1701) and adjusting the cathode impedance to ground Z5 (block 1702) to achieve a desired fraction f for reduction of the anode voltage and a phase shift in the cathode voltage at the frequency of the VHF source power, in accordance with the impedance confinement technique. The method further includes setting the baffle 450 to a height that is below the wafer plane (block 1703) by a sufficient amount to avoid or at least reduce counteraction by the baffle 450 against with the desired confinement of the plasma from the side wall 128 by the impedance confinement technique. In the example of the reactor of FIG. 1A, this distance is on the order of about one inch.

While the foregoing is directed to embodiments of the invention, other and further embodiments of the invention may be devised without departing from the basic scope thereof, and the scope thereof is determined by the claims that follow.

What is claimed is:

1. A method of processing a workpiece in a plasma reactor chamber, the chamber including a ceiling and a side wall, a workpiece support pedestal with a workpiece support surface within the chamber, a pumping annulus with a pumping port between said pedestal and said side wall, and a plasma processing region provided between said pedestal and said ceiling, said method comprising:
    constraining plasma in said chamber away from said floor of said pumping annulus, said constraining including providing an annular baffle extending from said pedestal into said pumping annulus and constricting a flow of gas and plasma through said pumping annulus;
    compensating for asymmetry of gas flow attributable to said pumping port, said compensating including providing a gas flow equalizer below said baffle having an eccentrically shaped gas flow opening surrounding said pedestal;
    modifying radial distribution of plasma ion density over said pedestal, said modifying including providing a magnetic plasma steering field having an edge high plasma ion density distribution tendency; and
    locating said baffle at a distance below said workpiece support surface, said distance providing an edge low plasma ion density distribution tendency that compensates said edge high plasma ion density distribution tendency of said magnetic plasma steering field.

2. The method of claim 1 further comprising:
    constraining plasma in said chamber away from said side wall and providing an impedance confinement condition wherein said side wall has a VHF voltage lying between the VHF voltages on said workpiece and on said ceiling electrode, respectively.

3. The method of claim 2 wherein said distance of said baffle below said workpiece support surface is sufficient for said impedance confinement condition to reduce plasma ion density over or near the periphery of said workpiece support pedestal.

4. The method of claim 3 wherein said providing an impedance confinement condition comprises separately selecting or adjusting: (a) a capacitance to ground of said ceiling electrode, and (b) a capacitance to ground of said workpiece support surface.

5. The method of claim 4 wherein said VHF voltage on said side wall is zero and said VHF voltages on said ceiling electrode and said workpiece are of different phases.

6. The method of claim 4 wherein said VHF voltages on said ceiling electrode and workpiece are of opposite phases.

7. The method of claim 6 wherein said VHF voltages on said ceiling electrode and on said workpiece are fractions f and (1−f) of the VHF voltage from a supply, where f is a number less than one determined by the capacitances to ground of said ceiling electrode and said wafer support surface.

8. The method of claim 3 wherein said distance is on the order of about 2.5 cm.

9. The method of claim 1 wherein said controlling a magnetic steering field comprises separately controlling the magnitude and direction of D.C. current in each one of an inner coil overlying said ceiling and an outer coil overlying said ceiling.

10. The method of claim 1 wherein said baffle comprises an annular disk formed of a conductive material, and said method further comprises grounding said annular disk.

11. The method of claim 1 wherein said gas flow equalizer comprises a conductive plate, and said method further comprises grounding said conductive plate.

12. A method of processing a workpiece in a plasma reactor chamber, the chamber includes a ceiling and a side wall, a workpiece support pedestal with a workpiece support surface within the chamber, a pumping annulus with a pumping port between said pedestal and said side wall, and a plasma processing region provided between said pedestal and said ceiling, said method comprising:
    first constraining plasma in said chamber away from said floor of said pumping annulus, said first constraining comprising providing an annular baffle extending from said pedestal into said pumping annulus to constrict flow of gas and plasma through said pumping annulus;
    compensating for asymmetry of gas flow attributable to said pumping port, said compensating including providing a gas flow equalizer below said baffle having an eccentric gas flow opening surrounding said pedestal;
    second constraining plasma in said chamber away from said side wall, said second constraining plasma including providing an impedance confinement condition wherein said side wall has a VHF voltage lying between VHF voltages on said workpiece and on said ceiling electrode; and
    locating said baffle at a distance below said workpiece support surface, wherein said distance of said baffle below said workpiece support surface is sufficient for said impedance confinement condition to reduce plasma ion density over or near the periphery of said workpiece support pedestal.

13. The method of claim 12 wherein providing an impedance confinement condition comprises separately selecting or adjusting: (a) a capacitance to ground of said ceiling electrode, and (b) a capacitance to ground of said workpiece support surface.

14. The method of claim 13 wherein said VHF voltage on said side wall is zero and said VHF voltages on said ceiling electrode and said workpiece are of different phases.

15. The method of claim 13 wherein said VHF voltages on said ceiling electrode and workpiece are of opposite phases.

16. The method of claim 15 wherein said VHF voltages on said ceiling electrode and on said workpiece are fractions f and (1−f) of the VHF voltage from a supply, where f is a number less than one determined by the capacitances to ground of said ceiling electrode and said wafer support surface.

17. The method of claim 12 wherein said distance is on the order of about 2.5 cm.

18. The method of claim 12 wherein said baffle comprises an annular disk formed of a conductive material, said method further comprises grounding said annular disk.

19. The method of claim 18 wherein said gas flow equalizer comprises a conductive plate, said method further comprises grounding said conductive plate.

20. A method of processing a workpiece in a plasma reactor chamber, the chamber including a ceiling and a side wall, a workpiece support pedestal with a workpiece support surface within the chamber, a pumping annulus between said pedestal and said side wall, and a plasma processing region provided between said pedestal and said ceiling , said method comprising:

placing a workpiece on said pedestal;

providing an annular baffle radially extending from said pedestal into said pumping annulus to constrict flow of gas and plasma through said pumping annulus;

providing a gas flow equalizer below said baffle, said baffle having an eccentrically distributed gas flow opening surrounding said pedestal;

providing a controlling a magnetic plasma steering field having an edge high plasma ion density distribution tendency;

providing an impedance confinement condition wherein said side wall has a VHF voltage lying between the VHF voltages on said workpiece and on said ceiling electrode; and locating said baffle at an axial distance below said workpiece support surface on the order of about 2 cm.

* * * * *